(12) United States Patent
Shinokawa et al.

(10) Patent No.: US 9,773,848 B2
(45) Date of Patent: Sep. 26, 2017

(54) ORGANIC EL DISPLAY PANEL, PRODUCTION METHOD THEREFOR, AND ORGANIC EL DISPLAY DEVICE

(71) Applicant: JOLED INC., Tokyo (JP)

(72) Inventors: Yasuharu Shinokawa, Tokyo (JP); Kenichi Nendai, Tokyo (JP); Hiroyoshi Takezawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/035,348

(22) PCT Filed: Oct. 3, 2014

(86) PCT No.: PCT/JP2014/005058
§ 371 (c)(1),
(2) Date: May 9, 2016

(87) PCT Pub. No.: WO2015/072063
PCT Pub. Date: May 21, 2015

(65) Prior Publication Data
US 2016/0293681 A1    Oct. 6, 2016

(30) Foreign Application Priority Data

Nov. 12, 2013    (JP) .................................. 2013-233945

(51) Int. Cl.
*H01L 29/08*    (2006.01)
*H01L 29/04*    (2006.01)
(Continued)

(52) U.S. Cl.
CPC ...... *H01L 27/3246* (2013.01); *H01L 27/3211* (2013.01); *H01L 27/3248* (2013.01); *H01L 2227/323* (2013.01)

(58) Field of Classification Search
CPC ............. H01L 27/3246; H01L 27/3211; H01L 27/3248; H01L 2227/323
(Continued)

(56) References Cited

U.S. PATENT DOCUMENTS 5,443,922 A        8/1995   Nishizaki et al.
2002/0167267 A1*  11/2002   Sekiya ................ H01L 27/3288
                                                          313/500
(Continued)

FOREIGN PATENT DOCUMENTS

JP    05-163488    6/1993
JP    2002-075640  3/2002
(Continued)

OTHER PUBLICATIONS

English machine translation Japan Patent Application No. JP2011090909.*
(Continued)

*Primary Examiner* — Dzung Tran
(74) *Attorney, Agent, or Firm* — Greenblum & Bernstein, P.L.C.

(57) ABSTRACT

An organic EL display panel including: a substrate; banks linearly extending along one direction above the substrate; pixel electrodes spaced away from one another along the one direction, in each of first and second spaces among spaces defined by the banks; a light-emitting layer covering each pixel electrode in each of the first and second spaces; and a sub-bank crossing the one direction at least in the first space, and when defining each light-emitting layer portion covering a pixel electrode as a light-emitting portion and defining each area between light-emitting portions adjacent in the one direction as a non-light-emitting portion, a positive integer N exists for which the following holds true: among Nth non-light-emitting portions counting from one side along the (Continued)

one direction, the Nth non-light-emitting portion in the first space has the sub-bank and the Nth non-light-emitting portion in the second space does not have the sub-bank.

10 Claims, 12 Drawing Sheets

(51) Int. Cl.
*H01L 29/18* (2006.01)
*H01L 27/32* (2006.01)

(58) Field of Classification Search
USPC .......................... 257/40, 59, 79, 88; 438/34
See application file for complete search history.

(56) References Cited

U.S. PATENT DOCUMENTS

| 2006/0159895 | A1 | 7/2006 | Katagami et al. |
| 2009/0039778 | A1 | 2/2009 | Tomita |
| 2009/0153044 | A1 | 6/2009 | Yanagihara |
| 2011/0042691 | A1 | 2/2011 | Hayata et al. |
| 2011/0215305 | A1* | 9/2011 | Kim .................. H01L 51/52 257/40 |
| 2011/0242072 | A1* | 10/2011 | Ota ..................... G09G 3/3233 345/204 |
| 2011/0260955 | A1 | 10/2011 | Yoshida et al. |
| 2012/0007067 | A1* | 1/2012 | Kaneta ................ H01L 51/5206 257/40 |
| 2012/0091888 | A1 | 4/2012 | Yoshida et al. |
| 2012/0248465 | A1* | 10/2012 | Choi ................... H01L 27/3246 257/88 |

FOREIGN PATENT DOCUMENTS

| JP | 2006-201423 | 8/2006 |
| JP | 2007-227127 | 9/2007 |
| JP | 2009-043499 | 2/2009 |
| JP | 2009-146848 | 7/2009 |
| JP | 2011-023305 | 2/2011 |
| JP | 2011-054512 | 3/2011 |
| JP | 2011-090909 | 5/2011 |
| WO | 2008/149498 | 12/2008 |
| WO | 2009/144912 | 12/2009 |
| WO | 2010/070800 | 6/2010 |

OTHER PUBLICATIONS

International Search Report, mailed Nov. 4, 2014, in International Application No. PCT/JP2014/005058.

* cited by examiner

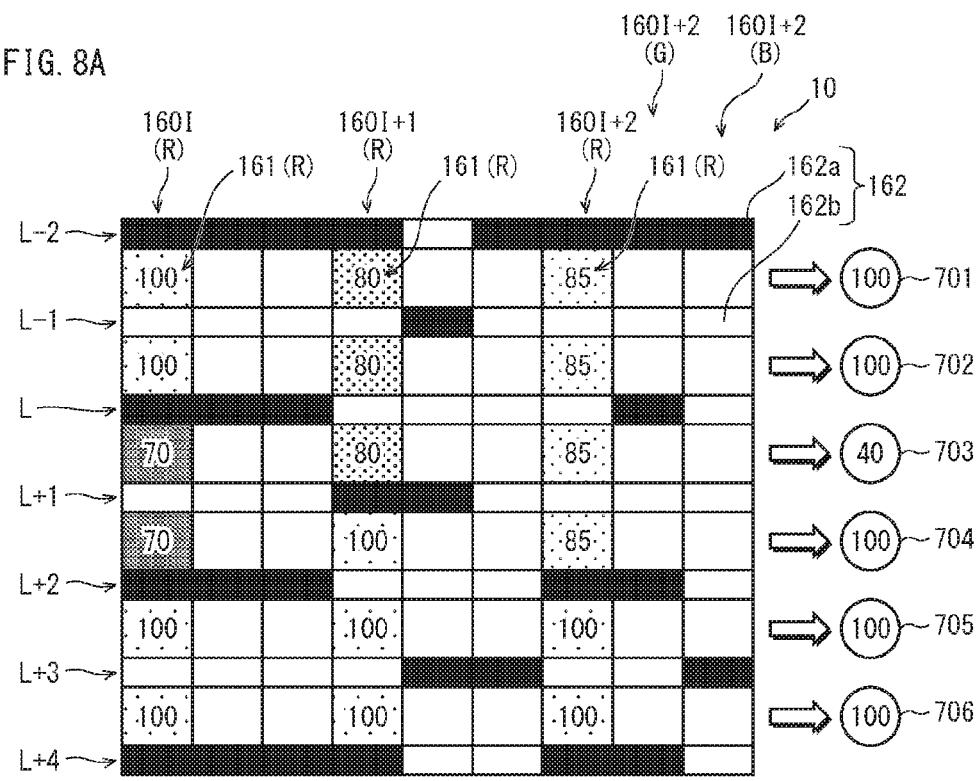
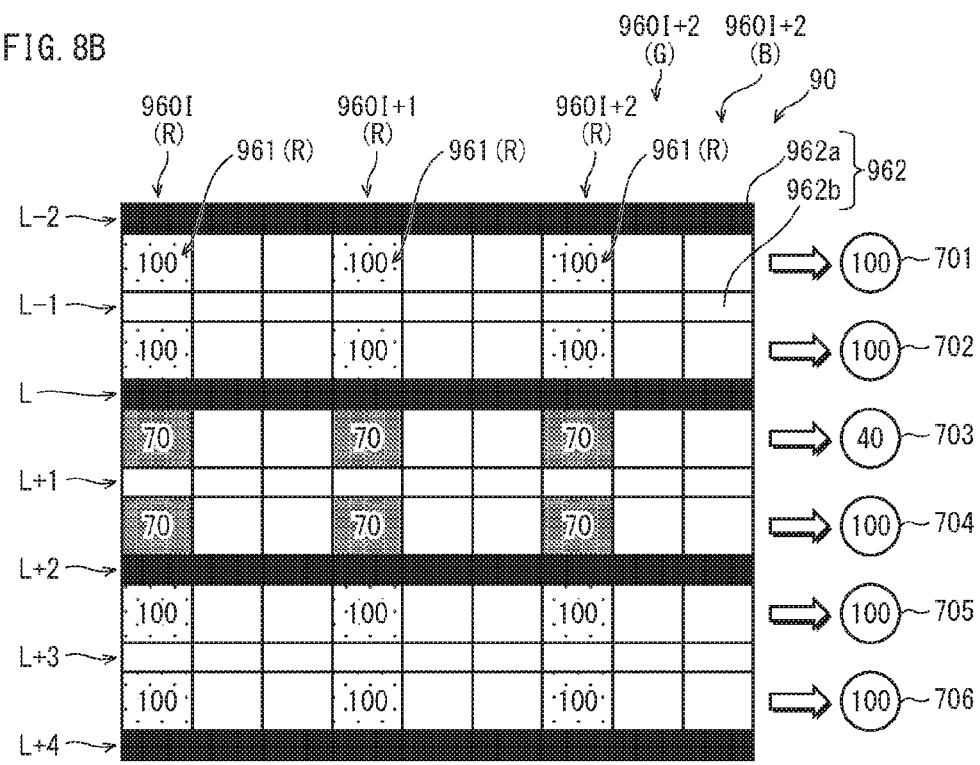

ORGANIC EL DISPLAY PANEL, PRODUCTION METHOD THEREFOR, AND ORGANIC EL DISPLAY DEVICE

TECHNICAL FIELD

The present invention relates to a display panel including organic electroluminescence (EL) elements, a manufacturing method of such a display panel, and an organic EL display device including such a display panel. In particular, the present invention relates to a technology of controlling luminance unevenness.

BACKGROUND ART

Research and development are in progress for increasing the size of display panels including organic EL elements. An organic EL element typically includes a pair of electrodes and one or more functional layers disposed between the electrode pair. The functional layers at least include a light-emitting layer containing an organic compound. The thickness of the light-emitting layer and luminance in light emission are co-related. Due to this, it is beneficial that in a display panel, light-emitting portions (light-emitting layer portions that actually emit light) have uniform thickness. Much research is being conducted as to how light-emitting portions can be provided with uniform thickness, in the endeavor to increase the size of display panels.

Meanwhile, typical methods applied in forming light-emitting layers are classified largely into dry processes and wet processes. One example of a dry process is vacuum vapor deposition. One example of a wet process is inkjet deposition. It is commonly regarded that wet processes are suitable for manufacturing display panels of large sizes, in terms of both accuracy and cost.

A typical organic EL display panel whose manufacturing involves a wet process includes banks disposed over a substrate. The banks define areas in which light-emitting layers are formed. The banks may be arranged according to one of the two following arrangements. One type of arrangement is the so-called pixel bank structure, where banks are arranged to form a grid pattern. The grid pattern defines areas respectively corresponding to light-emitting portions. The other type of arrangement is the so-called linear bank structure, where linear banks all extending in one same direction are arranged. The linear banks define a plurality of areas respectively corresponding to lines of light-emitting portions disposed along the one direction. One example of the linear bank structure can be found disclosed in Patent Literature 1.

With the linear bank structure, a solution containing an organic compound used for light-emitting layers is capable of flowing in areas between the linear banks, in parallel to the direction in which the linear banks extend. In the following, such a solution is referred to as an ink, and further, the direction in which the linear banks extend is referred to as a column direction. Due to this flow of ink, the risk is reduced of film thickness unevenness between light-emitting portions occurring, even if not the same amount of ink is applied to all positions along the column direction.

Further, ink typically has great surface tension. Due to this, when an abnormality occurs, such as drying of the ink progressing quickly at a certain area between banks or a foreign substance existing at a certain area between banks, ink gathers towards and is accumulated where the abnormality has occurred. In particular, with the linear bank structure, ink flow along the column direction occurs as described above. As such, when an abnormality occurs, this ink flow results in ink from a vast area gathering towards and being accumulated where the abnormality has occurred. This results in film thickness unevenness occurring over a relatively great area along the column direction. This problem can be found disclosed in Patent Literatures 2, 3, and 4.

In view of this problem, Patent Literatures 2, 3, and 4 disclose suppressing the gathering and accumulation of ink as described above by providing, in each space (inter-bank space 960) between banks 95, obstacles (sub-banks 94) restricting ink flow and each disposed at an area (a non-light-emitting portion 962) between a pair of light-emitting portions 961 disposed in the inter-bank space 960. FIG. 13 illustrates an organic EL display panel 90, which is one example of a display panel with such a structure.

CITATION LIST

Patent Literature

[Patent Literature 1]
 Japanese Patent Application Publication No. 2002-75640
[Patent Literature 2]
 Japanese Patent Application Publication No. 2009-43499
[Patent Literature 3]
 Japanese Patent Application Publication No. 2011-23305
[Patent Literature 4]
 Japanese Patent Application Publication No. 2011-90909

SUMMARY OF INVENTION

Technical Problem

Meanwhile, the structures disclosed in Patent Literatures 2, 3, and 4 are common in that positions of the sub-banks 94 do not change between different inter-bank spaces 960. In the example illustrated in FIG. 13, in every inter-bank space 960, one sub-bank 94 is disposed at each of the (L−2)th, the Lth, and the (L+2)th non-light-emitting portions 962, when counting the non-light-emitting portions 962 from the top of FIG. 13.

Here it should be noted that ink may gather and accumulate at a sub-bank 94, similar to how ink gathers and accumulates at a foreign substance. This is disclosed in FIG. 3 of Patent Literature 2. When this gathering and accumulation of ink at a sub-bank 94 occurs, film thickness unevenness between light-emitting portions 961 occurs near the sub-bank 94. Further, it should be noted that with the structure described above, film thickness unevenness between light-emitting portions 961 occurs along multiple sub-banks 94, and thus form a line along a direction perpendicular to the column direction.

Further, with the structure described above, ink would flow in substantially the same manner over a given column direction position in one inter-bank space 960 and over the same column direction position in another inter-bank space 960. Due to this, when an abnormality spanning over multiple inter-banks spaces 960 occurs, such as an abnormality in ink application amount or adhesion of a foreign substance, substantially the same positions of multiple inter-bank spaces 960 are affected by the abnormality. Consequently, light-emitting portions 961 having abnormal thicknesses are formed along such positions affected by the abnormality. Accordingly, positions where film thickness unevenness between light-emitting portions 961 occurs form a line along a direction crossing the inter-bank spaces 960.

When positions where film thickness unevenness between light-emitting portions 961 occurs form a line as described above, this line appears as a linear luminance unevenness of the display panel 90. Such a linear luminance unevenness is more prominent as compared to a spot-like luminance unevenness, and thus, the impression of wrongness experienced by users is greater.

In view of such problems, the present invention aims to provide an organic EL display panel not likely to exhibit such a linear luminance unevenness, a manufacturing method of such an organic EL display panel, and an organic EL display device including such an organic EL display panel.

Solution to Problem

One aspect of the present disclosure is an organic electroluminescence (EL) display panel including: a substrate; at least three banks above the substrate all linearly extending along one direction; a plurality of pixel electrodes disposed spaced away from one another along the one direction, in each of a first inter-bank space and a second inter-bank space included among inter-bank spaces defined by the at least three banks, each inter-bank space being a space between a different pair of adjacent ones of the at least three banks; a light-emitting layer in each of the first inter-bank space and the second inter-bank space, the light-emitting layer covering at least a portion of each of the pixel electrodes disposed in said each of the first inter-bank space and the second inter-bank space; and a sub-bank disposed at least in the first inter-bank space, the sub-bank crossing the one direction, and in the organic EL display panel, when defining each portion of the light-emitting layer that covers one of the pixel electrodes as a light-emitting portion of the organic EL display panel, and defining each area between a pair of light-emitting portions adjacent in the one direction as a non-light-emitting portion of the organic EL display panel, there exists a positive integer N for which the following holds true: among Nth non-light-emitting portions of the organic EL display panel counting from one side of the organic EL display panel along the one direction, the Nth non-light-emitting portion in the first inter-bank space has the sub-bank disposed therein and the Nth non-light-emitting portion in the second inter-bank space does not have the sub-bank disposed therein.

Advantageous Effect of Invention

In the organic EL display panel pertaining to one aspect of the present invention, along an imaginary line connecting the Nth non-light-emitting portions in the inter-bank spaces in which light-emitting portions exist, counted from one side of the organic EL display panel along the one direction, both a non-light-emitting portion having the sub-bank and a non-light-emitting portion not having the sub-bank exist. Due to this, the organic EL display panel is not likely to exhibit a linear luminance unevenness.

Figure 1:
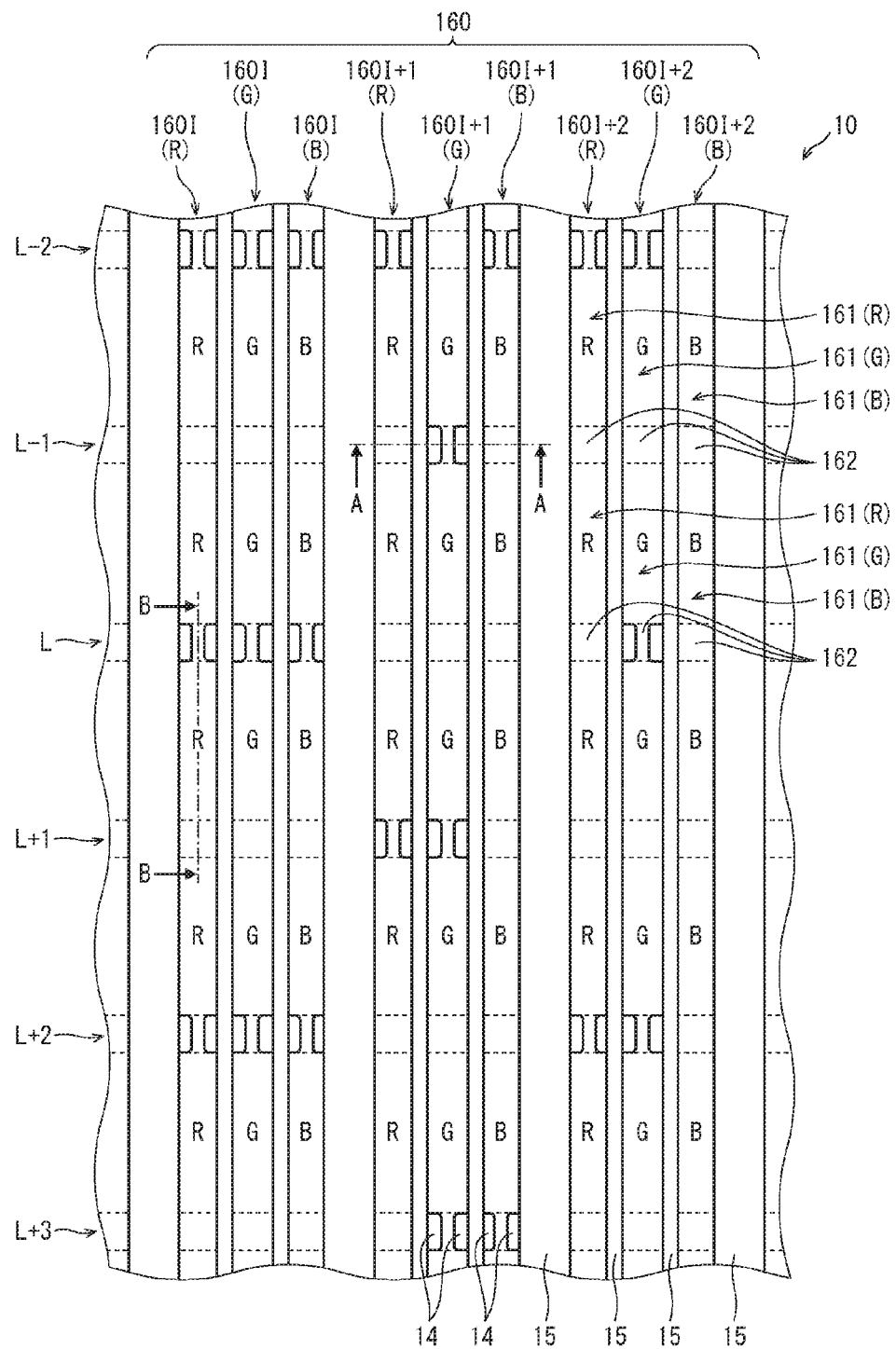
FIG. 1 is a schematic plan view illustrating a part of an organic EL display panel 10 pertaining to embodiment 1 of the present invention.
Figure 2A:
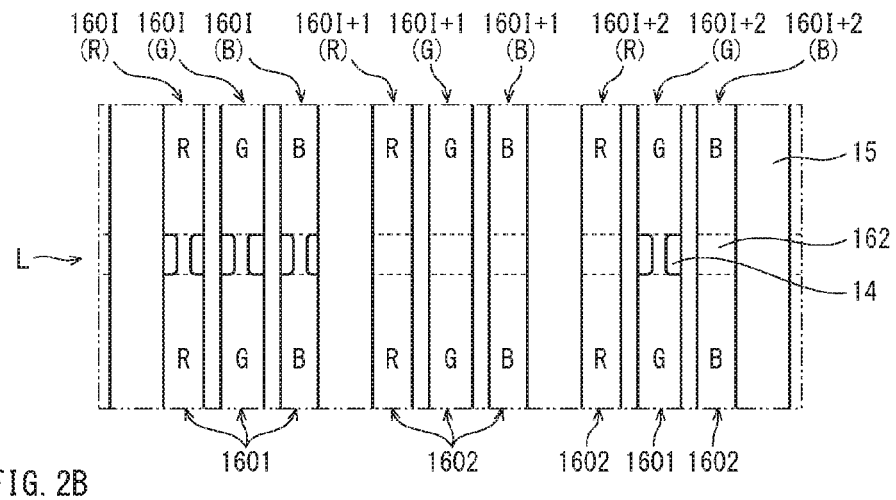
Figure 2B:
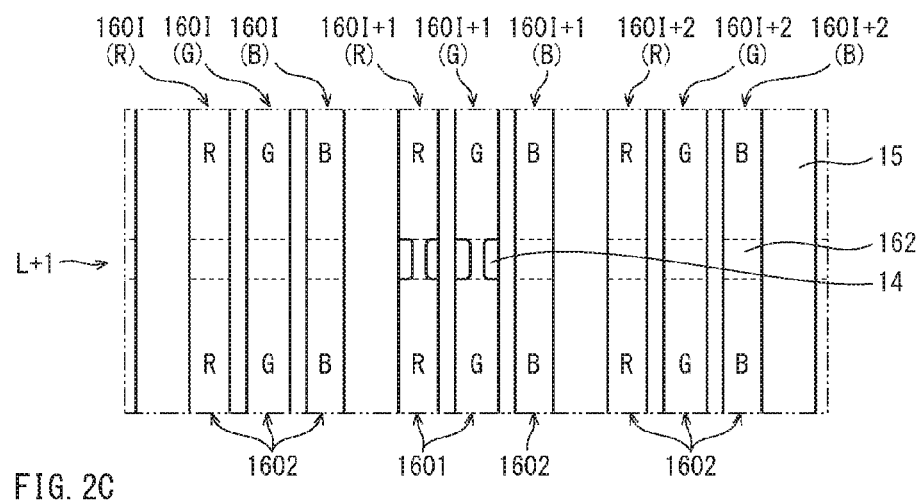
Figure 2C:
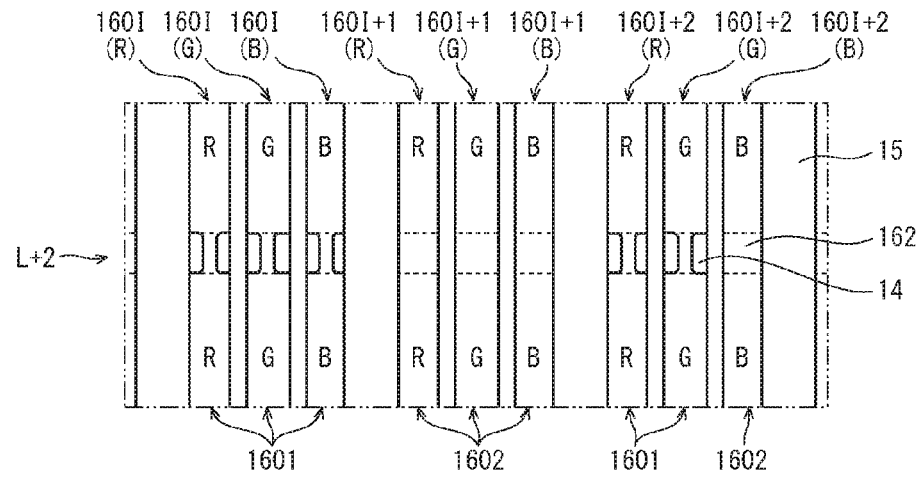

Each of FIGS. 2A through 2C illustrates a part of FIG. 1 in magnified state, with FIG. 2A illustrating a part near an Lth non-light-emitting portion 162 in magnified state, FIG. 2B illustrating a part near an (L+1)th non-light-emitting portion 162 in magnified state, and FIG. 2C illustrating a part near an (L+2)th non-light-emitting portion 162 in magnified state.

Figure 3:
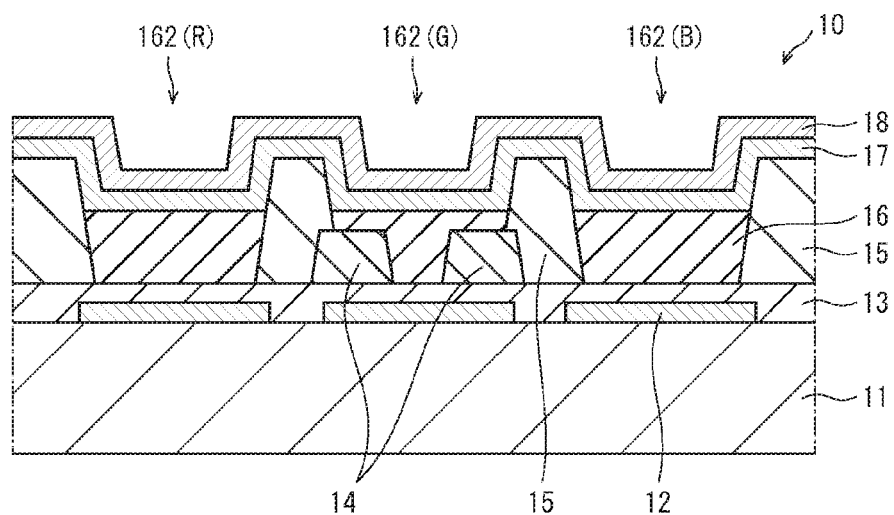

FIG. 3 is a schematic illustrating a cross-section taken along line A-A in FIG. 1.

Figure 4:
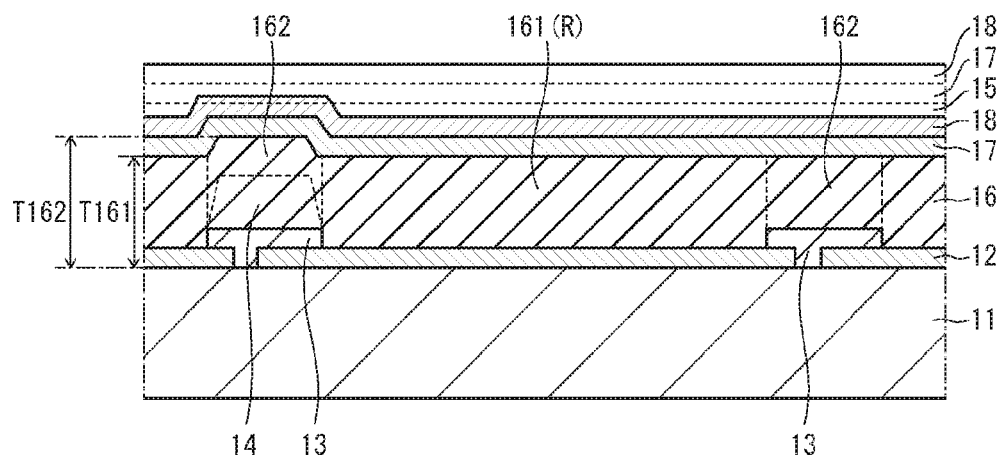

FIG. 4 is a schematic illustrating a cross-section taken along line B-B in FIG. 1.

Figure 5:
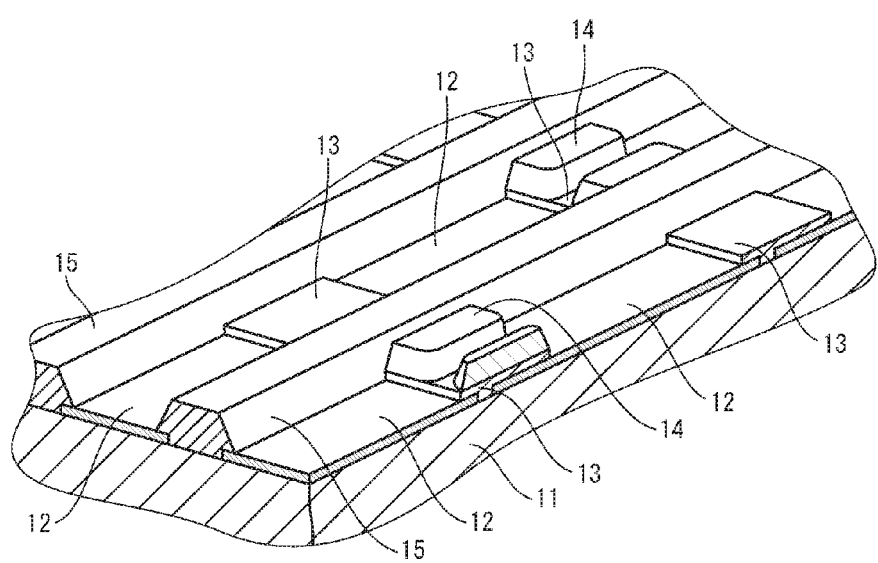

FIG. 5 is a schematic perspective view illustrating the structure of the organic EL display panel 10 before the forming of light-emitting layers 16.

Figure 6A:
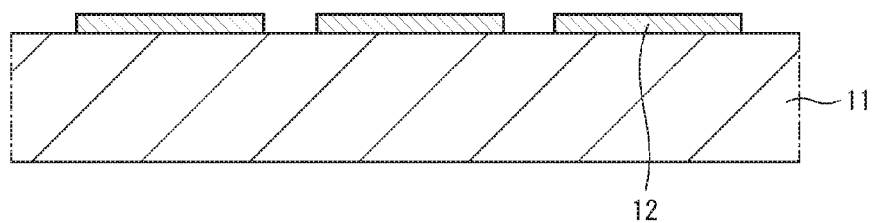
Figure 6B:
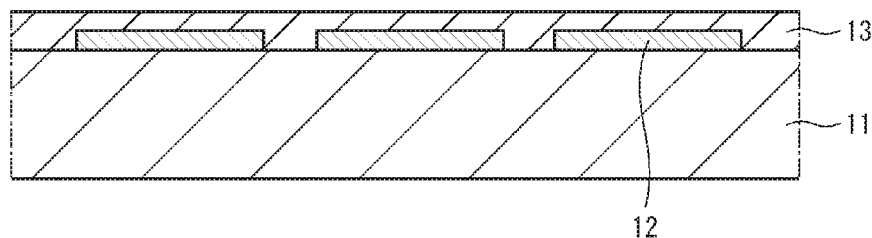
Figure 6C:
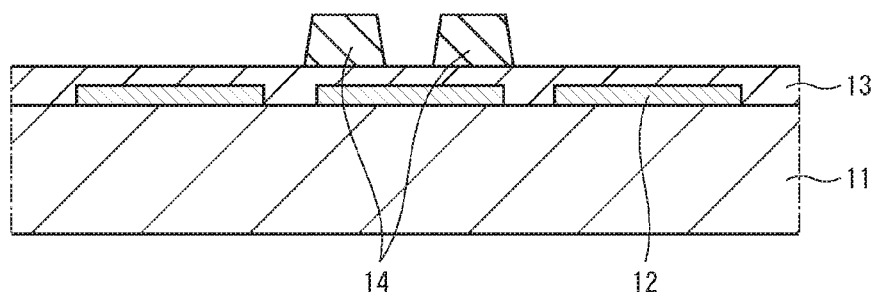

Each of FIGS. 6A through 6C is a schematic illustrating a cross-section during a manufacturing process of the organic EL display panel 10, with FIG. 6A corresponding to a pixel electrode forming process, FIG. 6B corresponding to a pixel insulating layer forming process, and FIG. 6C corresponding to a sub-bank forming process.

Figure 7A:
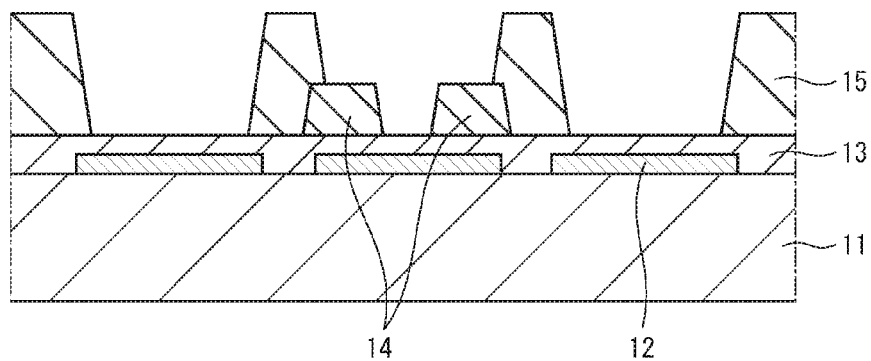
Figure 7B:
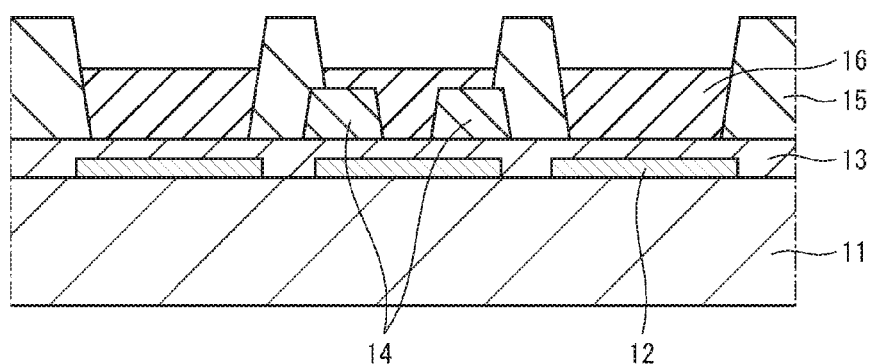
Figure 7C:
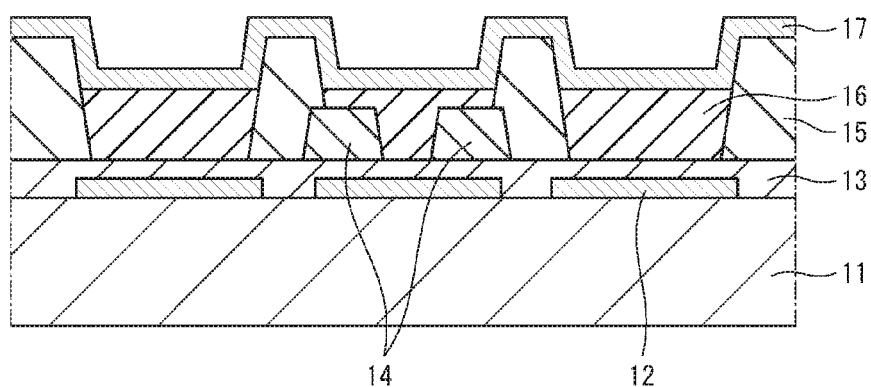

Each of FIGS. 7A through 7C is a schematic illustrating a cross-section during a manufacturing process of the organic EL display panel 10, with FIG. 7A corresponding to a bank forming process, FIG. 7B corresponding to a light-emitting layer forming process, and FIG. 7C corresponding to a counter electrode forming process.

FIG. 8A is a diagram for explaining film thickness unevenness between light-emitting portions 161 occurring in the organic EL display panel 10, and FIG. 8B is a diagram for explaining film thickness unevenness between light-emitting portions 961 occurring formed in a comparative example.

Figure 9A:
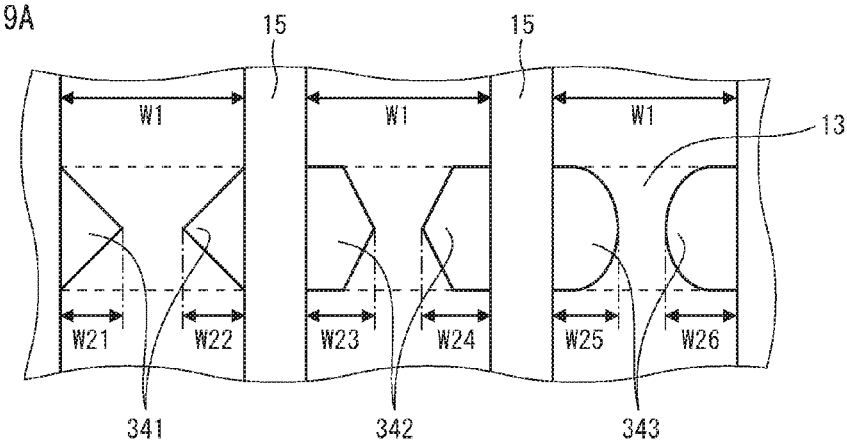
Figure 9B:
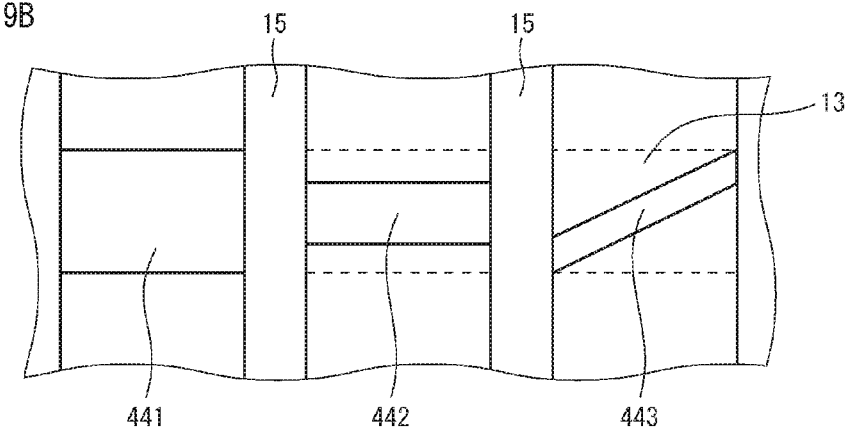
Figure 9C:
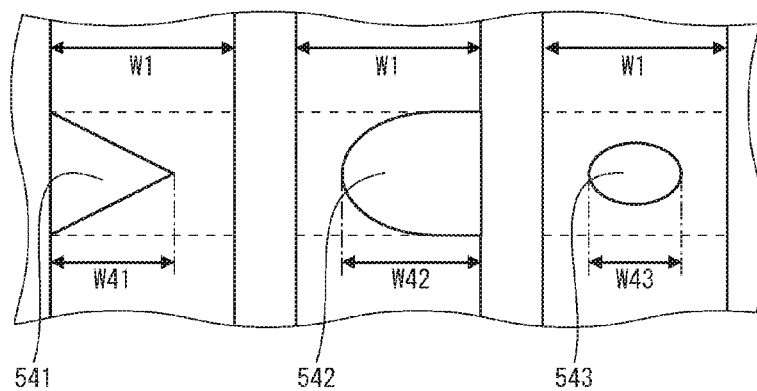

FIGS. 9A through 9C are schematic plan views illustrating the structures of sub-banks pertaining to modifications, with FIG. 9A illustrating the structures of sub-banks 341 through 343, FIG. 9B illustrating the structures of sub-banks 441 through 443, and FIG. 9C illustrating the structures of sub-banks 541 through 543.

Figure 10A:
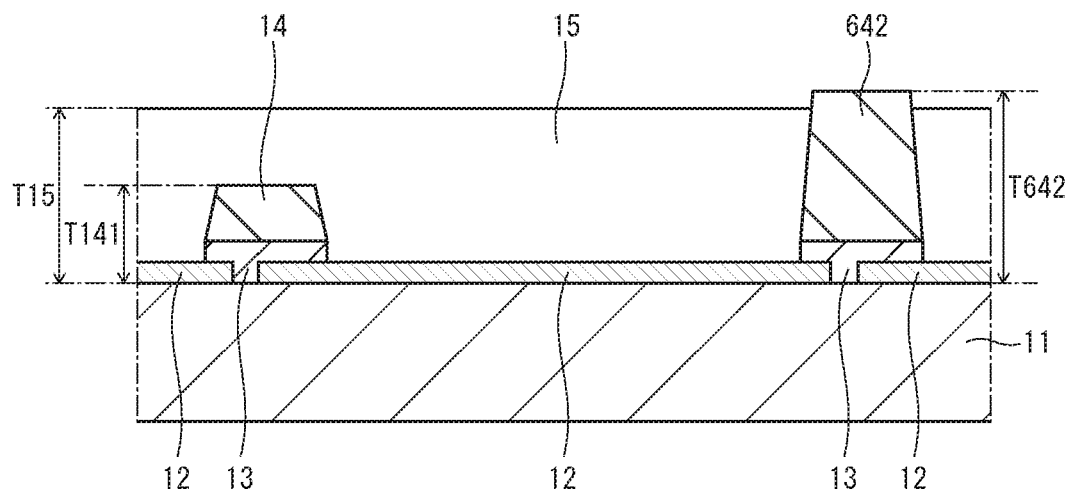
Figure 10B:
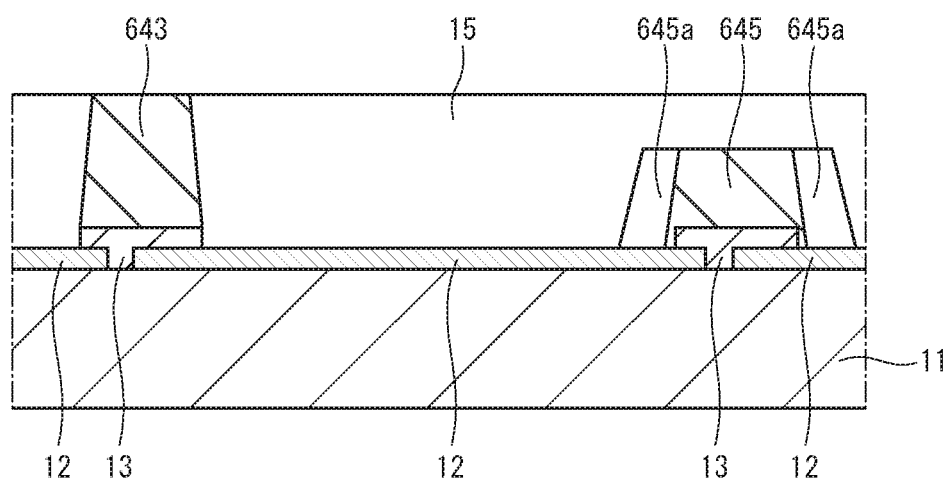

Each of FIGS. 10A and 10B is a schematic cross-sectional view illustrating the structures of sub-banks pertaining to the organic EL display panel 10 and modifications, with FIG. 10A illustrating the structures of a sub-bank 14 and a sub-bank 642, and FIG. 10B illustrating the structures of a sub-bank 643 and a sub-bank 645.

Figure 11:
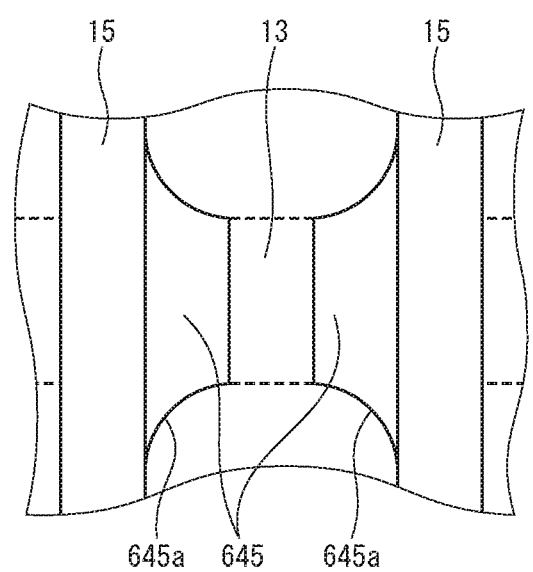

FIG. 11 is a schematic plan view illustrating the structure of the sub-bank 645.

Figure 12:
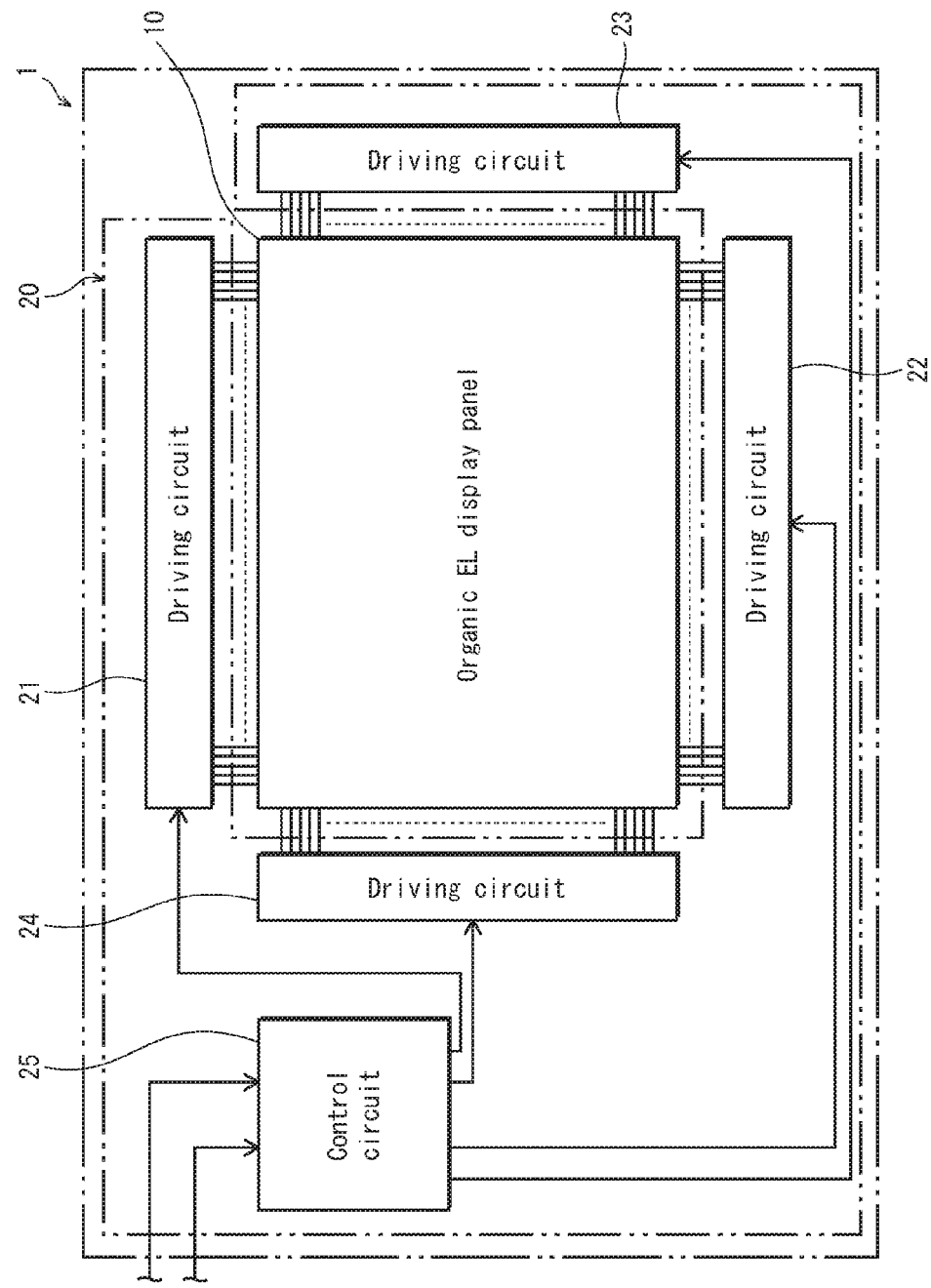

FIG. 12 is a block diagram illustrating the overall structure of an organic EL display device 1 pertaining to embodiment 2 of the present invention.

Figure 13:
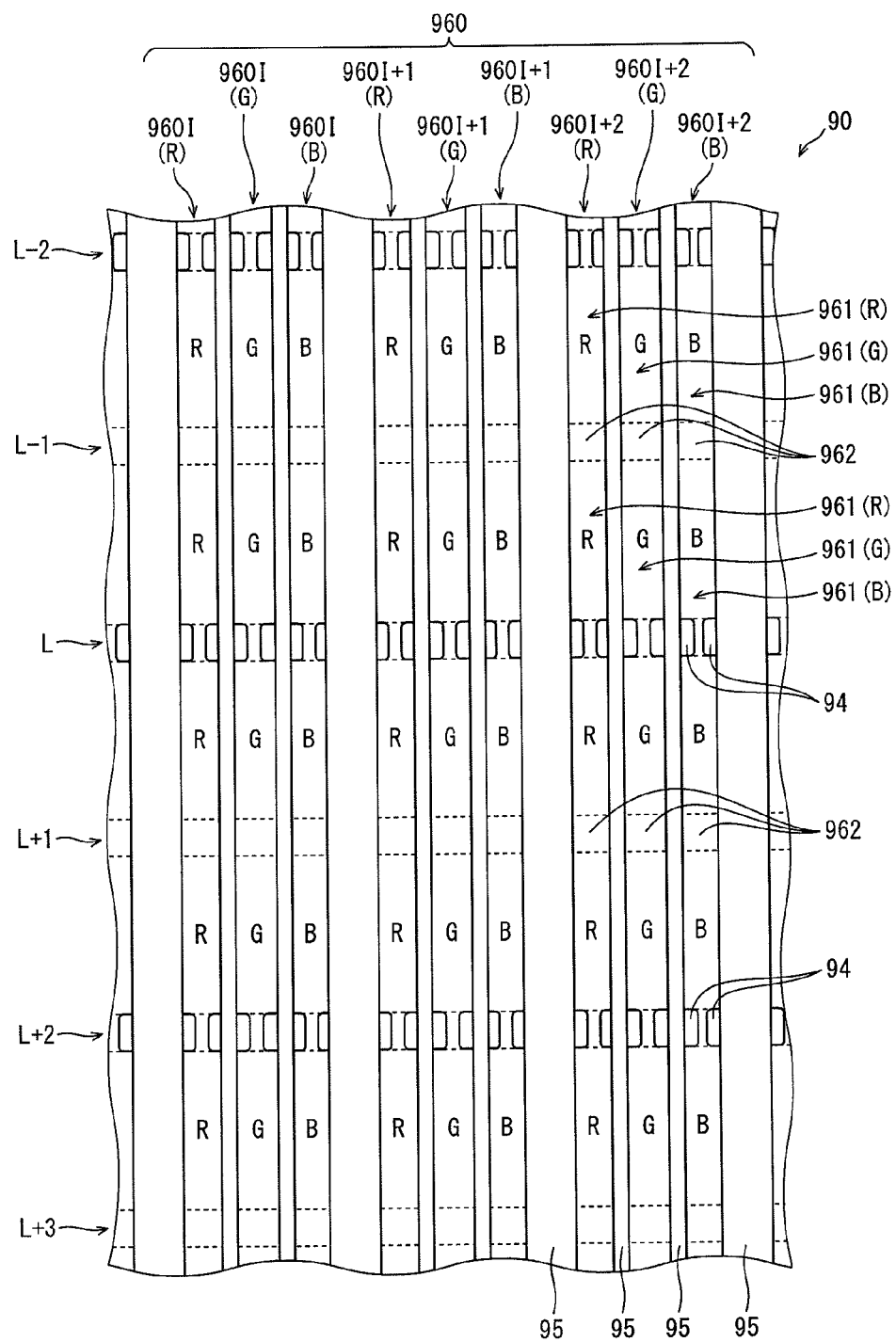

FIG. 13 is a schematic plan view illustrating a part of an organic EL display panel 90 pertaining to conventional technology.

DESCRIPTION OF EMBODIMENTS

Overview of Aspects of Present Invention

One aspect of the present disclosure is an organic electroluminescence (EL) display panel including: a substrate; at least three banks above the substrate all linearly extending along one direction; a plurality of pixel electrodes disposed spaced away from one another along the one direction, in each of a first inter-bank space and a second inter-bank space included among inter-bank spaces defined by the at least three banks, each inter-bank space being a space between a different pair of adjacent ones of the at least three banks; a light-emitting layer in each of the first inter-bank space and the second inter-bank space, the light-emitting layer covering at least a portion of each of the pixel electrodes disposed in said each of the first inter-bank space and the second inter-bank space; and a sub-bank disposed at least in the first inter-bank space, the sub-bank crossing the one direction, and in the organic EL display panel, when defining each portion of the light-emitting layer that covers one of the pixel electrodes as a light-emitting portion of the organic EL display panel, and defining each area between a pair of light-emitting portions adjacent in the one direction as a non-light-emitting portion of the organic EL display panel, there exists a positive integer N for which the following holds true: among Nth non-light-emitting portions of the organic EL display panel counting from one side of the organic EL display panel along the one direction, the Nth non-light-emitting portion in the first inter-bank space has the sub-bank disposed therein and the Nth non-light-emitting portion in the second inter-bank space does not have the sub-bank disposed therein.

In the organic EL display panel pertaining to one aspect of the present invention, along an imaginary line connecting the Nth non-light-emitting portions in the inter-bank spaces in which light-emitting portions exist, counted from one side of the organic EL display panel along the one direction, both a non-light-emitting portion having the sub-bank and a non-light-emitting portion not having the sub-bank exist. Accordingly, even if gathering and accumulation of ink at a sub-bank occurs during the forming of light-emitting layers, the risk is reduced of film thickness unevenness between light-emitting portions forming a line. Further, along the imaginary line, the manner in which ink flows differs between the first inter-bank space and the second inter-bank space. Due to this, even if an abnormality such as ink application amount abnormality and foreign substance adhesion occurs spanning across multiple inter-bank spaces, the risk is reduced of film thickness unevenness between light-emitting portions forming a line. That is, the risk is reduced of a linear luminance unevenness being formed.

In the organic EL display panel pertaining to one aspect of the present invention, in each of the first inter-bank space and the second inter-bank space, two or more sub-banks may be disposed along the one direction spaced away from one another by a distance of no smaller than 300 µm and no greater than 3000 µm. This structure reduces the risk of film thickness unevenness between light-emitting portions occurring and reduces the risk of film thickness unevenness occurring in an inter-bank space due to an abnormality in the inter-bank space such as drying of ink progressing quickly at a certain area or a foreign substance existing at a certain area.

In the organic EL display panel pertaining to one aspect of the present invention, in the first inter-bank space, the sub-banks maybe disposed spaced away from one another by a first distance along the one direction, and in the second inter-bank space, the sub-banks may be disposed spaced away from one another by a second distance along the one direction, the second distance differing from the first distance. According to this structure, even if an abnormality such as ink application amount abnormality and foreign substance adhesion occurs spanning across multiple inter-bank spaces, the level of film thickness unevenness in the first inter-bank space and the level of film thickness unevenness in the second inter-bank space differ from one another, and thus, even if luminance unevenness occurs where the abnormality has occurred, the luminance unevenness does not stand out.

In the organic EL display panel pertaining to one aspect of the present invention, each light-emitting portion in the first inter-bank space may emit the same color as each light-emitting portion in the second inter-bank space. According to this structure, the risk is reduced of the organic EL display panel exhibiting a linear luminance unevenness, even when considering only inter-bank spaces of the same color. Thus, the organic EL display panel has high display quality.

In the organic EL display panel pertaining to one aspect of the present invention, a surface portion liquid-repellency of the sub-bank may be smaller than a surface portion liquid-repellency of the banks. This structure reduces the risk of insufficient covering by ink and film thickness unevenness between light-emitting portions occurring near where a surface of a bank and a surface of a sub-bank come in contact with one another.

In the organic EL display panel pertaining to one aspect of the present invention, the light-emitting layer may extend continuously from one of two adjacent light-emitting portions into a non-light-emitting portion between the two adjacent light-emitting portions and in which a sub-bank is disposed, and further into the other one of the two adjacent light-emitting portions, and a height of the light-emitting layer, with respect to a top surface of the substrate, may be greater at a portion of the light-emitting layer corresponding to the non-light-emitting portion than at portions of the light-emitting layer corresponding to the two adjacent light-emitting portions. This structure enhances the effect of the sub-banks of restricting ink flow, and thus, reduces the risk of film thickness unevenness occurring in an inter-bank space due to an abnormality in the inter-bank space such as drying of ink progressing quickly at a certain area or a foreign substance existing at a certain area.

In the organic EL display panel pertaining to one aspect of the present invention, the sub-bank may have a portion located on a pixel electrode, and a surface of the portion of the sub-bank on the pixel electrode may be curved concave towards one bank. This structure allows ink to spread easily to a surface of a portion of a sub-bank located on a pixel electrode, and thus reduces the risk of a short-circuit between electrodes occurring due to insufficiently covering by ink.

In the organic EL display panel pertaining to one aspect of the present invention, each non-light-emitting portion in the first inter-bank space having a sub-bank disposed therein may have at least a portion where a width of a bottom surface of the sub-bank along a direction perpendicular to the one direction covers 50% or more of a width of a bottom surface of the first inter-bank space along the direction perpendicular to the one direction. This structure ensures the sub-banks to sufficiently achieve the effect of restricting ink flow, and thus, reduces the risk of film thickness unevenness occurring in an inter-bank space due to an abnormality in the inter-bank space such as drying of ink progressing quickly at a certain area or a foreign substance existing at a certain area.

In the organic EL display panel pertaining to one aspect of the present invention, a height of the sub-bank, with respect to a top surface of the substrate, may be no less than 10% and no greater than 110% of a height of the banks, with respect to the top surface of the substrate. This structure ensures the sub-banks to sufficiently achieve the effect of restricting ink flow, and thus, reduces the risk of film thickness unevenness occurring in an inter-bank space due to an abnormality in the inter-bank space such as drying of ink progressing quickly at a certain area or a foreign substance existing at a certain area. In addition, this structure reduces the risk of ink flowing along a sub-bank and over a bank.

In the organic EL display panel pertaining to one aspect of the present invention, a height of the sub-bank, with respect to a top surface of the substrate, may be equal to a height of the banks, with respect to the top surface of the substrate. This structure enables forming sub-banks and banks in a same single process, and enables efficient manufacture of the organic EL display panel.

One aspect of the present disclosure is an organic EL display device including the organic EL display panel of any one of claims 1 through 10. According to this structure, the organic EL display device includes an organic EL display panel not likely to exhibit a linear luminance unevenness. Thus, the organic EL display device has high display quality.

One aspect of the present invention is a method of manufacturing an organic EL display panel, including: preparing a substrate; forming, on or above the substrate, a first pixel electrode column and a second pixel electrode column each by arranging a plurality of pixel electrodes in line along one direction so as to be spaced away from one another; defining a plurality of light-emitting portion forming areas and a plurality of non-light-emitting portions formed areas by defining at least a part of an area above a pixel electrode as one light-emitting portion forming area and an area between a pair of light-emitting portion forming areas adjacent along the one direction as one non-light-emitting portion forming area; forming a sub-bank crossing the one direction at some of the non-light-emitting portion forming areas; and forming a plurality of banks extending along the one direction so that each of the first pixel electrode column and the second pixel electrode column is between a pair of the banks, and in the method, when defining a space between a pair of the banks accommodating the first pixel electrode column as a first inter-bank space and a space between a pair of the banks of accommodating the second pixel electrode column as a second inter-bank space, the forming of the sub-bank is performing such that there exists a positive integer N for which the following holds true: among Nth non-light-emitting portions counting from one side of the organic EL display panel along the one direction, the Nth non-light-emitting portion in the first inter-bank space has the sub-bank disposed therein and the Nth non-light-emitting portion in the second inter-bank space does not have the sub-bank disposed therein.

The method pertaining to one aspect of the present disclosure reduces the risk of a linear luminance unevenness occurring.

The method pertaining to one aspect of the present disclosure may further include forming a light-emitting layer in each of the first inter-bank space and the second inter-bank space, the light-emitting layer formed by using nozzles that are arranged in line along the one direction and that eject a solution containing an organic compound and moving the nozzles in a direction crossing the one direction. According to this, the process of forming the light-emitting layer is shortened. Further, even if there exists a nozzle ejecting a different amount of solution, the solution ejected from the nozzles flows along the one direction, whereby the amount of solution applied is averaged out and thus the risk of luminance unevenness between light-emitting portions occurring is reduced.

Note that in the present disclosure, any term or expression related to an upward direction should be construed as referring to a relatively upward direction that is determined relatively according to the positional relationships between components based on an order in which layers are disposed in a multiple-layer structure, and should not be construed as referring to an absolute upward direction (i.e., the vertical direction). Further, terms and expression related to the upward direction, such as "above" and "over", should be construed as encompassing both a case where one component is disposed in an upward direction with respect to another component with a space therebetween and a case where one component is disposed in an upward direction with respect to another component and in direct contact with the other component.

Embodiment 1

The following describes an organic EL display panel 10 pertaining to embodiment 1 of the present invention, with reference to the accompanying drawings. Note that the drawings referred to in the following are schematics, and therefore, objects may be illustrated therein at sizes differing from their actual sizes.

1. Overview of Organic EL Display Panel 10

The following describes the overall structure of the organic EL display panel 10 (referred to in the following as the panel 10), with reference to FIG. 1 and FIGS. 2A through 2C. FIG. 1 is a schematic plan view illustrating a part of the panel 10. Each of FIGS. 2A through 2C illustrates a part of FIG. 1 in magnified state.

The panel 10 is an organic EL display panel, and thus, makes use of an electric-field light-emitting phenomenon occurring with an organic compound. The panel 10 has a linear bank structure composed of multiple linear banks 15 (at least three banks 15) each extending along the top-bottom direction in FIG. 1. Note that in the following, the direction in which the banks 15 extend is referred to as a "column direction". Further, in the following, the space between a pair of adjacent banks 15 is defined as an inter-bank space 160. In each inter-bank space 160, a plurality of light-emitting portions 161 and a plurality of non-light-emitting portions 162 are disposed in alternation along the column direction. Thus, each non-light-emitting portion 162 is located between two adjacent light-emitting portions 161. Further, sub-banks 14 are disposed in each inter-bank space 160. Each sub-bank 14 is disposed at one non-light-emitting portion 162. However, only some of the light-emitting portions 162 in each inter-bank space 160 have sub-banks 14. Further, each sub-bank 14 perpendicularly crosses the column direction.

As such, in the panel 10, a plurality of banks 15 and a plurality of inter-bank spaces 160 are lined up. Note that in the following, in order to simplify explanation, the direction perpendicular to the column direction is referred to as a "row direction". The row direction corresponds to the left-right direction in FIG. 1. Further, note that in the present embodiment, the column direction corresponds to the one direction.

In the present embodiment, the light-emitting portions 161 are classified into red light-emitting portions 161R emitting red light, green light-emitting portions 161G emitting green light, and blue light-emitting portions 161B emitting blue light. Further, in the present embodiment, the inter-bank spaces 160 are classified into red inter-bank spaces 160R in which only red light-emitting portions 161R are disposed, green inter-bank spaces 160G in which only green light-emitting portions 161G are disposed, and blue inter-bank spaces 160B in which only blue light-emitting portions 161B are disposed. Further, each set of one red light-emitting element 161R, one green light-emitting element 161G, and one blue light-emitting element 161B that are lined up along the row direction corresponds to one pixel.

In the panel 10, there exists a positive integer N for which the following holds true: among Nth non-light-emitting portions 162 counting from one side of the panel 10 along the column direction, the Nth non-light-emitting portion 162 in a first inter-bank space 1601 has a sub-bank 14, and the Nth non-light-emitting portion 162 in a second inter-bank space 1602 does not have a sub-bank 14. In the following, a first inter-bank space 1601 for a positive integer N is an inter-bank space 160 that has light-emitting portions 161 disposed therein, and further, has a sub-bank 14 at the Nth non-light-emitting portion 162. Meanwhile, in the following, a second inter-bank space 1602 for a positive integer N is an inter-bank space 160 that has light-emitting portions 161 disposed therein, but does not have a sub-bank 14 at the Nth non-light-emitting portion 162.

The following describes this in specific, with reference to FIGS. 2A through 2C. FIG. 2A illustrates a part near an Lth non-light-emitting portion 162 in magnified state, FIG. 2B illustrates a part near an (L+1)th non-light-emitting portion 162 in magnified state, and FIG. 2C illustrates a part near an (L+2)th non-light-emitting portion 162 in magnified state, when counting the non-light-emitting portions 162 in the panel 10 from the top of FIG. 1. L denotes a positive integer.

In the panel 10, each of the inter-bank spaces 160I (R), 160I (G), 160I (B), and 160I+2 (G) has a sub-bank 14 at the Lth non-light-emitting portion 162, as illustrated in FIG. 2A. Meanwhile, each of the inter-bank spaces 160I+1 (R), 160I+1 (G), 160I+1 (B), 160I+2 (R), and 160I+2 (B) does not have a sub-bank 14 at the Lth non-light-emitting portion 162. Accordingly, one of the inter-bank spaces 160I (R), 160I (G), 160I (B), and 160I+2 (G) may be considered as a first inter-bank space 160I for positive integer L. Further, one of the inter-bank spaces 160I+1 (R), 160I+1 (G), 160I+1 (B), 160I+2 (R), and 160I+2 (B) may be considered as a second inter-bank space 1602 for positive integer L. Similarly, as illustrated in FIG. 2B, each of the inter-bank spaces 160I+1 (R), 160I+1 (G) may be considered as a first inter-bank space 160I for positive integer L+1, and each of the inter-bank spaces 160I (R), 160I (G), 160I (B), 160I+1 (B), 160I+2 (R), 160I+2 (G), and 160I+2 (B) may be considered as a second inter-bank space 1602 for positive integer L+1. Further, as illustrated in FIG. 2C, each of the inter-bank spaces 160I (R), 160I (G), 160I (B), 160I+2 (R), and 160I+2 (G) may be considered as a first inter-bank space 160I for positive integer L+2, and each of the inter-bank spaces 160I+1 (R), 160I+1 (G), 160I+1 (B), and 160I+2 (B) may be considered as a second inter-bank space 1602 for positive integer L+2.

As such, in the panel 10, for each of multiple positive integers N, there exists a combination of a first inter-bank space 1601 and a second inter-bank space 1602. Further, the combination of a first inter-bank space 1601 and a second inter-bank space 1602 for one positive integer N differs from the combination of a first inter-bank space 1601 and a second inter-bank space 1602 for another positive integer N.

2. Structure of Components

The following describes the structures of the respective components of the panel 10, with reference to FIGS. 3, 4, and 5. FIG. 3 is a schematic illustrating a cross-section taken along line A-A in FIG. 1. FIG. 4 is a schematic illustrating a cross-section taken along line B-B in FIG. 1. FIG. 5 is a schematic perspective view illustrating the structure of the panel 10 before the forming of light-emitting layers 16.

The present embodiment describes an example where the panel 10 is a top-emission-type display panel, with the display surface thereof located upwards in FIGS. 3 and 4. Thus, in the following, description is provided on the assumption that a component illustrated upwards than another component in FIGS. 3 and 4 is located upwards with respect to the other component in the panel 10.

The panel 10 includes: a substrate 11; pixel electrodes 12; pixel insulating layers 13; sub-banks 14; banks 15; light-emitting layers 16; a counter electrode 17; and a sealing layer 18.

(a) Substrate 11

The substrate 11 includes: a base layer; a thin film transistor (TFT) layer on the base layer; and an interlayer insulating layer over the base layer and the TFT layer. The base layer, the TFT layer, and the interlayer insulating layer are not illustrated in any of the drawings.

The base layer supports the panel 10, and has a flat plate-like shape. The base layer is formed by using a material having an electrically insulative property, such as a glass material, a resin material, a semiconductor material, or a metal material coated with an insulating layer.

The TFT layer is formed on the top surface of the base layer, and is composed of a plurality of TFTs and wiring. Each TFT corresponds to a different one of the pixel electrodes 12, and upon receiving a drive signal from a circuit external to the panel 10, electrically connects the corresponding pixel electrode 12 with an external power source. Each TFT includes multiple layers such as electrodes, a semiconductor layer, and an insulating layer. The wiring electrically connects the TFTs, the pixel electrodes 12, the external power source, the external circuit, and the like.

The interlayer insulating layer planarizes at least areas of the top surface of the substrate 11 where the light-emitting portions 161 are to be formed. Specifically, due to the substrate 11 including the TFT layer, the top surface of the substrate 11 has surface irregularities. The interlayer insulating layer covers such surface irregularities. Further, the interlayer insulating layer also provides electrical insulation between TFTs and pixel electrodes 12 that are not connected via wiring, by filling the spaces between such TFTs and pixel electrodes. For example, the interlayer insulating layer is formed by using an organic material having an electrically insulative property and positive-type photosensitivity, such as acrylic resin, polyimide resin, siloxane resin, or phenol resin.

(b) Pixel Electrodes 12

The pixel electrodes 12 supply carriers to the light-emitting layers 16. For example, when the pixel electrodes 12 serve as anodes, the pixel electrodes 12 supply holes to the light-emitting layers 16. Further, the pixel electrodes 12 have flat plate-like shapes. However, for example, when connection between the pixel electrodes 12 and the corresponding TFTs is established by providing contact holes in the interlayer insulating layer, the pixel electrodes 12 may have surface irregularities corresponding to the contact holes. Further, in each inter-bank space 160, a plurality of pixel electrodes 12 are disposed on the substrate 11, spaced away from one another along the column direction.

Here, since the panel 10 is a top-emission-type display panel, the pixel electrodes 12 are formed by using a material having electrical conductivity and optical reflectivity. For example, the pixel electrodes 12 may be formed by using a metal such as silver, aluminum, or molybdenum, or an alloy of such metals.

(c) Pixel Insulating Layer 13

The pixel insulating layer 13 provides electrical insulation between adjacent pixel electrodes 12. As illustrated in FIGS. 3 and 5, the panel 10 includes the pixel insulating layer 13 in plurality, and each pixel insulating layer 13 has a flat plate-like shape and extends continuously along the row direction. Specifically, each pixel insulating layer 13 is formed over the substrate 11 to cover opposing end portions of a pair of pixel electrodes 12 that are adjacent along the column direction. The pixel insulating layers 13 may be formed by using a material having an electrically insulative property. For example, the pixel insulating layers 13 are formed by using an inorganic material such as silicon oxide or silicon nitride, or any of the organic materials described above as being usable for forming the interlayer insulating layer.

(d) Sub-Banks 14

The sub-banks 14 are provided to restrict ink flow along the column direction. Such ink flow may occur during the forming of the light-emitting layers 16, due to ink containing an organic compound used for forming the light-emitting layers 16 flowing along the column direction. Each sub-bank 14 is composed of two portions, each having a square frustum shape. In the cross-sections illustrated in FIGS. 3 and 4, the square frustum shape has a forward-tapered trapezoidal shape, becoming thinner as approaching the top. As already described above, in each inter-bank space 160, only some of the pixel insulating layers 13 in the inter-bank space 160 have sub-banks 14. Further, each sub-bank 14 is composed of two portions each protruding along the row direction from one of the two banks 15 defining the inter-bank space 160. Thus, each sub-bank 14 perpendicularly crosses the column direction. Here, note that the tips of the two protruding portions of each sub-bank 14 are not in contact with each other (i.e., are spaced away from one another). Thus, the ink is able to flow through this space. Further, as illustrated in FIG. 5, each sub-bank 14 has a lateral surface with curved corner portions. Providing a sub-bank 14 with such a lateral surface promotes the spread of ink near the sub-bank 14 during the forming of the light-emitting layers 16.

The sub-banks 14 are formed by using a material having an electrically insulative property, such as any of the inorganic materials described above as being usable for forming the pixel insulating layers 13, or any of the organic materials described above as being usable for forming the interlayer insulating layer.

(e) Banks 15

The banks 15 are provided to restrict ink flow along the row direction during the forming of the light-emitting layers 16. Each bank 15 has a linear shape extending along the column direction. In the cross-section illustrated in FIG. 3, each bank 15 has a forward-tapered trapezoidal shape, becoming thinner as approaching the top. The banks 15 are disposed over the substrate 11, the pixel electrodes 12, the pixel insulating layers 13, and the sub-banks 14. Further, at least three banks 15 are disposed over the substrate 11, so that each pixel electrode 12 has one bank 15 at each side thereof along the row direction. Further, each bank 15 covers opposing end portions of a pair of pixel electrodes 12 that are adjacent along the row direction, and thereby provides electrical insulation between the pixel electrodes 12.

For example, the banks 15 are formed by using any of the organic materials described above as being usable for forming the interlayer insulating layer. Beneficially, the banks 15 are formed by using a material having resistivity to organic solvents and whose shape and property does not change excessively through processing such as etching and baking. Further, fluoridization treatment may be applied to surfaces of the banks 15 in order to provide the surfaces of the banks 15 with liquid repellency.

(f) Light-Emitting Layers 16

The light-emitting layers 16 are formed by using an organic compound, and emit light when holes and electrons recombine therein. Each light-emitting layer 16 has a linear shape extending along the column direction. Further, in each inter-bank space 160, one light-emitting layer 16 is disposed that covers the respective pixel electrodes 12 disposed in the inter-bank space 160. For example, the light-emitting layer 16 in each inter-bank space 160 covers surfaces of pixel electrodes 12, surfaces of pixel insulating layers 13, surfaces of sub-banks 14, and lateral surfaces of banks 15.

Here, note that only portions of each light-emitting layer 16 that receive carriers from pixel electrodes 12 emit light. As such, as illustrated in FIG. 4, each light-emitting layer 16 can be divided into portions corresponding to light-emitting portions 161 and portions corresponding to non-light-emitting portions 162. Specifically, each portion of the light-emitting layer 16 located on a portion of a pixel electrode 12 that is not covered by a pixel insulating layer 13 corresponds to a light-emitting portion 161. Each portion of the light-emitting layer 16 located on a pixel insulating layer 13 corresponds to a non-light-emitting portion 162. In other words, a portion of a light-emitting layer 16 located above a pixel electrode 12 corresponds to a light-emitting portion 161, and a portion of the light-emitting layer 16 located between two light-emitting portions 161 that are adjacent along the column direction corresponds to a non-light-emitting portion 162.

As illustrated in FIG. 4, each light-emitting layer 16 extends continuously from one light-emitting portion 161 into one non-light-emitting portion 162, and further into another light-emitting portion 161 that is adjacent to the one light-emitting portion 161. Accordingly, the film thicknesses of light-emitting portions 161 lined up along the column direction can be average out, due to the ink applied with respect to the pixel electrodes 12 in the forming of the light-emitting layer 16 flowing along the column direction over pixel insulating layers 13.

Meanwhile, sub-banks 14 are disposed above some pixel insulating layers 13. The sub-banks 14 have the effect of restricting ink flow during the forming of the light-emitting layer 16 to a certain extent. Accordingly, even when an abnormality occurs, such as drying of the ink progressing quickly at a certain area or a foreign substance existing at a certain area, the risk is reduced of ink gathering and being accumulated where the abnormality has occurred, and the risk is reduced of film thickness unevenness between light-emitting portions occurring over a relatively great area along the column direction.

The light-emitting layers 16 are formed by using an organic material which has a light-emitting property and a film of which can be formed through a wet process. For example, the light-emitting layers 16 may be formed by using a conventional fluorescent substance or a phosphorescent substance, such as the compounds, derivatives, and complexes disclosed in Japanese Patent Application Publication H5-163488.

(g) Counter Electrode 17

The counter electrode 17 forms electrical conduction paths by forming, with each of the pixel electrodes 12, an electrode pair that sandwiches a light-emitting layer 16. The counter electrode 17 supplies carriers to the light-emitting layers 16. For example, when the counter electrode 17 serves as a cathode, the counter electrode 17 supplies electrons to the light-emitting layers 16. The counter electrode 17 is disposed along top surfaces of the light-emitting layers 16 and surfaces of the banks 15 that the light-emitting layers 16 expose. Further, the counter electrode 17 is a single electrode shared by all of the light-emitting layers 16 of the panel 10.

Due to the panel 10 being a top-emission-type display panel, the counter electrode 17 is formed by using a material having both light transmissivity and electrical conductivity. For example, the counter electrode 17 may be formed by using indium tin oxide (ITO) or indium zinc oxide (IZO).

(h) Sealing Layer 18

The sealing layer 18 protects the light-emitting layers 16 from moisture, air, etc., and thus prevents or reduces the risk of the light-emitting layers 16 undergoing degradation. The sealing layer 18 covers the top surface of the counter electrode 17, and thus extends continuously over the entire panel 10. Due to the panel 10 being a top-emission-type display panel, the sealing layer 18 is formed by using a material having light transmissivity, such as silicon nitride or silicon oxynitride.

(i) Additional Components

While not illustrated in FIG. 3 or FIG. 4, additional components such as color filters and an upper substrate may be disposed or adhered over the sealing layer 18. Such additional components achieve effects such as adjusting display color characteristics of the display 10, improving physical strength of the display 10, and preventing intrusion of moisture, air, etc., into the panel 10.

3. Manufacturing Method of Organic EL Display Panel 10

The following describes a manufacturing method of the panel 10, with reference to FIGS. 6A through 6C and FIGS. 7A through 7C. Each of FIGS. 6A through 6C is a schematic illustrating a cross-section of the panel 10 during a manufacturing process. Similarly, each of FIGS. 7A through 7C is a schematic illustrating a cross-section of the panel 10 during a manufacturing process. Note that all of FIGS. 6A, 6B, 6C, 7A, 7B, and 7C illustrate the same cross-section of the panel 10 as FIG. 3, which is the cross-section along line A-A in FIG. 1.

(a) Substrate Preparation Process

First, the substrate 11 is prepared. Specifically, each of the TFT layer and the interlayer insulating layer is formed by forming a necessary film over the base layer through sputtering, chemical vapor deposition (CVD), or spin-coating, and then patterning the film so formed through photolithography. In preparing the substrate 11, additional processing such as plasma treatment, ion implantation, and baking may be performed.

(b) Pixel Electrode Forming Process

Subsequently, the pixel electrodes 12 are formed on the substrate 11, as illustrated in FIG. 6A. For example, first, a metal film is formed on the substrate 11 through vapor deposition or sputtering. Then, patterning of the metal film so formed is performed through photolithography. The forming of the pixel electrodes 12 is performed by disposing, on the substrate 11, a line of pixel electrodes 12 along the column direction with the pixel electrodes 12 spaced away from one another, and forming a plurality of such lines of pixel electrodes 12. As such, pixel electrodes 12 forming a two-dimensional array are formed on the substrate 11.

(c) Pixel Insulating Layer Forming Process

Subsequently, the pixel insulating layers 13 are formed over the substrate 11, over certain portions of the pixel electrodes 12. For example, the pixel insulating layers 13 are formed as follows. First, a film of an inorganic material having an electrically-insulative property (e.g., silicon oxide) is formed over the substrate 11 to cover the pixel electrodes 12, through CVD. Further, patterning of the film so formed is performed through photolithography, to form the pixel insulating layers 13, each of which having a flat plate-like shape, extending along the row direction on the substrate 11, and covering opposing end portions of pixel electrodes 12 adjacent along the column direction.

Here, note that an area above a portion of a pixel electrode 12 that is not covered by a pixel insulating layer 13 corresponds to where a light-emitting portion 161 is to be formed (referred to in the following as a light-emitting portion 161 forming area). Further, an area above a portion of a pixel insulating layer 13 that is located between two light-emitting portion 161 forming areas that are adjacent along the column direction corresponds to where a non-light-emitting portion 162 is to be formed (referred to in the following as a non-light-emitting portion 162 forming area). Thus, in the present embodiment, this process corresponds to a process of defining a plurality of light-emitting portion forming areas and a plurality of non-light-emitting portions formed areas by defining at least a part of an area above a pixel electrode as one light-emitting portion forming area and an area between a pair of light-emitting portion forming areas adjacent along the one direction (i.e., the column direction) as one non-light-emitting portion forming area.

(d) Sub-Bank Forming Process

Subsequently, the sub-banks 14 are formed on certain areas of each pixel insulating layer 13, as illustrated in FIG. 6C. For example, an organic material having positive photosensitivity (e.g., acrylic resin) is applied over the substrate 11 through spin coating, so as to cover the pixel insulating layers 13. Then, patterning of the applied organic material is performed through photolithography, so that the organic material remains only on certain areas of each pixel insulating layer 13. Thus, the sub-banks 14 are formed. Alternatively, the sub-banks 14 may be formed by applying the organic material only on certain areas of each pixel insulating layer 13 in the first place through printing or the like.

Here, the sub-banks 14 are formed as illustrated in FIG. 5, such that each sub-bank 14 is disposed on a portion of a pixel insulating layer 13 that corresponds to a non-light-emitting portion 162 forming area, and such that each sub-bank 14 perpendicularly crosses the column direction. For example; the sub-banks 14 are formed so that each sub-bank 14 is composed of two portions each protruding along the row direction from one of the two banks 15 (formed later) at both sides of the sub-bank 14. Further, the sub-banks 14 are formed such that the tips of the two protruding portions of each sub-bank 14 are not in contact with each other (i.e., are spaced away from one another), in order to provide a path through which ink is able to flow in a later-performed manufacturing process. Further in addition, the sub-banks 14 are formed such that each sub-bank 14 has a lateral surface with curved corner portions. The sub-banks 14 can be formed in such manner by appropriately setting the pattern of the photomask used for photolithography.

Further, in this manufacturing process, the forming of the sub-banks 14 is performed with respect to a plurality of lines extending along the column direction, each of which including a plurality of light-emitting portion 161 forming areas and a plurality of non-light-emitting portion 162 forming areas, so that there exists a positive integer N for which the following holds true: among Nth non-light-emitting portion 162 forming areas counting from one side of the panel 10 along the column direction, the Nth non-light-emitting portion 162 forming area in at least one of the plurality of lines has a sub-bank 14 disposed therein, and the Nth non-light-emitting portion 162 forming area in at least one of the plurality of lines does not have a sub-bank 14 disposed therein.

(e) Bank Forming Process

Subsequently, the banks 15 are formed over the substrate 11, over portions of pixel electrodes 12, portions of pixel insulating layers 13, and portions of sub-banks 14, as illustrated in FIG. 7A. For example, the banks 15 are formed by applying an organic material having positive photosensitivity (e.g., acrylic resin) on the substrate 11 through spin coating, so as to cover the pixel electrodes 12, the pixel insulating layers 13, and the sub-banks 14. Here, the application of the organic material is performed so that the film of the applied organic material has a thickness greater than the thickness of the sub-banks 14. Further, patterning of the applied organic material is performed through photolithography, so that the banks 15 extend along the column direction and so that each line of pixel electrodes 12 has one bank 15 at each side thereof along the row direction. Further, the forming of the banks 15 is performed such that each bank 15 extends linearly along the column direction while covering opposing end portions of pixel electrodes 12 that are adjacent along the row direction. Alternatively, the banks 15 may be formed through printing, in which case patterning such as described above becomes unnecessary.

In addition, surface treatment for providing surfaces of the banks 15 with repellency against ink applied in a later-performed manufacturing process may be performed. Such surface treatment may be performed by using, for example, an alkaline solution, water, an organic solvent, or plasma. Such surface treatment prevents or reduces the risk of ink flowing over the banks 15 in the later-described light-emitting layer forming process.

Further, as a result of the bank forming process, a plurality of inter-bank spaces 160 are formed, one between each pair of adjacent banks 15. In each of the inter-bank spaces 160 exists one of the plurality of lines extending along the column direction, each of which including a plurality of light-emitting portion 161 forming areas and a plurality of non-light-emitting portion 162 forming areas. In addition, an inter-bank space 160 in which there exists one of the plurality of lines in which a sub-bank 14 was disposed at the Nth non-light-emitting portion 162 in the sub-bank forming process is a first inter-bank space 1601, and an inter-bank space 160 in which there exists one of the plurality of lines in which a sub-bank 14 was not disposed at the Nth non-light-emitting portion 162 in the sub-bank forming process is a second inter-bank space 1602.

(f) Light-Emitting Layer Forming Process

Subsequently, the light-emitting layers 16 are formed in the inter-bank spaces 160, as illustrated in FIG. 7B. Specifically, an ink is prepared by mixing an organic compound used for forming the light-emitting layers 16 and a solvent at a predetermined ratio. Further, this ink is applied to the inside of each inter-bank space 160 through inkjet printing. Note that in the manufacturing of the panel 10, the ink is applied such that the top surface of the applied ink is higher than the top surfaces of the sub-banks 14. Applying the ink in such a manner enables the ink to flow over the sub-banks 14. Further, the forming of the light-emitting layers 16 is completed by causing the solvent in the ink to evaporate through drying. The application of ink may be performed by using an ink dispenser, by nozzle coating, by spin coating, or by printing.

In the present embodiment, the panel 10 includes light-emitting portions 161 of the three colors red, green, and blue. The light-emitting portions 161 of one color are formed by using an ink differing from the ink used for forming the light-emitting portions 161 of another color. Specifically, the forming of the light-emitting portions 161 of the three colors, or that is, the forming of light-emitting layers 16 of the three different colors may be performed, for example, by applying the inks of the three colors one after another by using three different nozzles each capable of ejecting ink of one of the three colors, or by applying the inks of the three colors at the same time by using a triple nozzle having three nozzles and capable of ejecting inks of all three colors at the same time.

Beneficially, due to the panel 10 having banks 15 forming the linear bank structure, the forming of light-emitting layers 16 of one color is performed by lining up nozzles ejecting ink of the one color along the column direction, and moving the nozzles in a direction crossing the column direction each time ejection of the ink with respect to one inter-bank space 160 is completed. Using multiple nozzles in such a manner reduces the amount of time required for the application of ink, and consequently reduces the amount of time required for performing the light-emitting layer forming process. Further, causing multiple nozzles to eject ink with respect to each inter-bank space 160 in such a manner results in ink droplets ejected from the nozzles connecting with one another along the column direction once arriving in the inter-bank space 160. Due to this, even if the nozzles include a nozzle ejecting an ink amount differing from the others (i.e., an abnormal amount of ink), the amount of ink applied with respect to different areas in the inter-bank space 160 is averaged out due to ink flowing along the column direction once arriving in the inter-bank space 160. This reduces the risk of film thickness unevenness between light-emitting portions 161 occurring, or in other words, reduces the risk of luminance unevenness occurring.

Through the light-emitting layer forming process, the light-emitting layers 16 are formed, each of which including light-emitting portions 161 and non-light-emitting portions 162. Specifically, a portion of a light-emitting layer 16 that is located on a portion of a pixel electrode 12 that is not covered with a pixel insulating layer 13 corresponds to a light-emitting portion 161, and a portion of a light-emitting layer 16 that is located on a pixel insulating layer 162 corresponds to a non-light-emitting portion 162.

(g) Counter Electrode Forming Process

Subsequently, the counter electrode 17 is formed along top surfaces of the light-emitting layers 16 and surfaces of the banks 15 exposed by the light-emitting layers 16. Specifically, the forming of the counter electrode 17 is performed by forming a film containing a material having light transmissivity and electric conductivity, such as ITO or IZO, along top surfaces of the light-emitting layers 16 and surfaces of the banks 15 exposed by the light-emitting layers 16 through vacuum vapor deposition or sputtering.

(f) Sealing Layer Forming Process

Subsequently, forming of the sealing layer 18, which covers the top surface of the counter electrode 17, is performed. Specifically, for example, a film of an inorganic material having an electrically insulating property (e.g., silicon oxide) is formed on the counter electrode 17, through sputtering or CVD.

The manufacturing of the organic EL display panel 10 is completed through such processes.

4. Effects Achieved

In the panel 10, there exists a positive integer N for which the following holds true: among Nth non-light-emitting portions 162 counting from one side of the panel 10 along the column direction, the Nth non-light-emitting portion 162 in a first inter-bank space 1601 has a sub-bank 14 disposed therein, and the Nth non-light-emitting portion 162 in a second inter-bank space 1602 does not have a sub-bank 14 disposed therein. A first inter-bank space 1601 for a positive integer N is an inter-bank space 160 that has light-emitting portions 161 disposed therein, and further, has a sub-bank 14 disposed therein at the Nth non-light-emitting portion 162. Meanwhile, a second inter-bank space 1602 for a positive integer N is an inter-bank space 160 that has light-emitting portions 161 disposed therein, but does not have a sub-bank 14 disposed therein at the Nth non-light-emitting portion 162. The following describes the effects achieved by this structure.

(a) Effects Related to Gathering and Accumulation of Ink at Sub-Bank 14

Due to having the above-described structure, in the panel 10, along an imaginary line connecting the Nth non-light-emitting portions 162 in inter-bank spaces 160 in which light-emitting portions 161 exist, counted from one side of the panel 10 along the column direction, at least one each of a non-light-emitting portion 162 having a sub-bank 14 and a non-light-emitting portion 162 not having a sub-bank 14 exists. For example, within the range illustrated in FIG. 1, each inter-bank space 160 includes light-emitting portions 161. Further, along an imaginary line connecting the Lth non-light-emitting portions 162 in the inter-bank spaces 160, sub-banks 14 are present at the Lth non-light-emitting portions 162 in the inter-bank space 160I (R), the inter-bank space 160I (G), the inter-bank space 160I (B), and the inter-bank space 160I+2 (G) (thus, each of these inter-bank spaces 160 may be considered as a first inter-bank space for L). Meanwhile, sub-banks 14 are not present at the Lth non-light-emitting portions 162 in the inter-bank space 160I+1 (R), the inter-bank space 160I+1 (G), the inter-bank space 160I+1 (B), the inter-bank space 160I+2 (R), and the inter-bank space 160I+2 (B) (thus, each of these inter-bank spaces 160 may be considered as a second inter-bank space for L). Due to this, even if gathering and accumulation of ink occurs near the sub-banks 14 during the forming of the light-emitting layers 16, due to at least one first inter-bank space 1601 and at least one second inter-bank space 1602 being present, areas at which the ink gathers and accumulate do not form a line along the row direction. Thus, the risk is reduced of film thickness unevenness between light-emitting portions 161 forming a line.

(b) Effects Related to Ink Application Amount Abnormality and Foreign Substance Adhesion Spanning Across Multiple Inter-Bank Spaces Due to having the above-described structure, in the panel 10, along an imaginary line connecting the Nth non-light-emitting portions 162 in inter-bank spaces 160 in which light-emitting portions 161 exist, at least one each of a non-light-emitting portion 162 having a sub-bank 14 and a non-light-emitting portion 162 not having a sub-bank 14 exists. Further, the manner in which ink flows during the forming of the light-emitting layers 16 differs between the first inter-bank space 1601 and the second inter-bank space 1602. As such, even if an abnormality spanning along the row direction, such as an abnormality in ink application amount or adhesion of a foreign substance, occurs near this position in the panel 10 during the forming of the light-emitting layers 16, the risk is reduced of film thickness unevenness between light-emitting portions 161 forming a line. The following describes this effect in detail, with reference to FIGS. 8A and 8B.

FIG. 8A illustrates film thickness unevenness between light-emitting portions 161 occurring in the panel 10 pertaining to the present embodiment, and FIG. 8B illustrates film thickness unevenness between light-emitting portions 961 occurring in the panel 90 pertaining to conventional technology.

In each of FIGS. 8A and 8B, a plurality of inter-bank spaces (inter-bank spaces 160 in FIG. 8A and inter-bank spaces 960 in FIG. 8B) are arranged along the left-right direction. Note that in FIG. 8A, each inter-bank space 160 is illustrated as being formed of a combination of a plurality of light-emitting portions 161 (each illustrated as having a substantially square shape) and a plurality of non-light-emitting portions 162 (each illustrated as having a substantially rectangular shape) arranged along the top-bottom direction. Similarly, in FIG. 8B, each inter-bank space 960 is illustrated as being formed of a combination of a plurality of light-emitting portions 961 (each illustrated as having a substantially square shape) and a plurality of non-light-emitting portions 962 (each illustrated as having a substantially rectangular shape) arranged along the top-bottom direction. In FIG. 8A, among the non-light-emitting portions 162, those in black (non-light-emitting portions 162a) each have a sub-bank 14 disposed therein, and those in white (non-light-emitting portions 162b) each do not have a sub-bank disposed therein. Similarly, in FIG. 8B, among the non-light-emitting portions 962, those in black (non-light-emitting portions 962a) each have a sub-bank 94 disposed therein, and those in white (non-light-emitting portions 962b) each do not have a sub-bank disposed therein. Further in the panel 10, different inter-bank spaces 160 have sub-banks 14 disposed at different positions, as illustrated in FIG. 8A. Meanwhile, in the panel 90, all inter-bank spaces 960 have sub-banks 94 disposed at the same positions, as illustrated in FIG. 8B.

In FIG. 8A, the non-light-emitting portions 162 are identified by being provided with symbols "L−2" through "L+4", counting from the top of the drawing. Similarly, in FIG. 8B, the non-light-emitting portions 962 are identified by being provided with symbols "L−2" through "L+4", counting from the top of the drawing.

Further, in each of FIGS. 8A and 8B, the symbols "701" through "706" indicate nozzles used for ink ejection. Here, the nozzles 701 through 706 eject ink with respect to the inter-bank spaces 160, 960 in an intermittent manner, according to the method described in part (f) of Section 3 above as being beneficial for a linear bank structure. Specifically, the nozzles 701 through 706 are lined up in the top-bottom direction (i.e., the direction in which the banks 15 and banks 95 (undepicted) extend), and the nozzles 701 through 706 are moved in the left-right direction (i.e., a direction crossing the direction in which the banks 15 and the banks 95 extend) while being caused to eject ink intermittently. Note that each of FIGS. 8A and 8B illustrate a state where the nozzles 701 through 706 have been used to eject ink with respect to only the inter-bank spaces corresponding to the color red (red inter-bank spaces 160R in FIG. 8A and red inter-bank spaces 960R in FIG. 8B).

Specifically, FIGS. 8A and 8B illustrate a state where the nozzles 701 through 706 have ejected ink with respect to the (L−1)th through (L+4)th light-emitting portions (light-emitting portions 161 in FIG. 8A and light-emitting portions 961 in FIG. 8B) in each inter-bank space (each inter-bank space 160 in FIG. 8A and each inter-bank space 960 in FIG. 8B). Further, in each of FIGS. 8A and 8B, the numbers in the circles indicating the nozzles 701 through 706 indicate the amount of ink that the corresponding nozzle has ejected per light-emitting portion (per light-emitting portion 161 in FIG. 8A and per light-emitting portion 961 in FIG. 8B). Here, note that while the nozzles 701, 702, 704, 705, and 706 have each ejected an ink amount of 100 per each light-emitting portion, the nozzle 703 has ejected an ink amount of 40 per each light-emitting portion, due to there being an abnormality with the nozzle 703.

Further, the numbers within the light-emitting portions (light-emitting portions 161 in FIG. 8A and light-emitting portions 961 in FIG. 8B) each indicate the thickness of the corresponding light-emitting portion. Here, for the sake of simplicity, description is provided in the following assuming that applied ink spreads completely uniformly over light-emitting portions (light-emitting portion 161 in FIG. 8A and light-emitting portions 961 in FIG. 8B) and over non-light-emitting portions without sub-banks (non-light-emitting portions 162b in FIG. 8A and non-light-emitting portions 962b in FIG. 8B), but does not spread over non-light-emitting portions with sub-banks (non-light-emitting portions 162a in FIG. 8A and non-light-emitting portions 962a in FIG. 8B). In addition, an assumption is made that due to the presence of the banks (undepicted banks 15 in FIG. 8A and undepicted banks 95 in FIG. 8B) between the inter-bank spaces (the inter-bank spaces 160 in FIG. 8A and the inter-bank spaces 960 in FIG. 8B), applied ink does not flow from one inter-bank space to another. Further, in each of FIGS. 8A and 8B, a film thickness of each light-emitting portion (each light-emitting portion 161 in FIG. 8A and each light-emitting portion 961 in FIG. 8B) is indicated by using the amount of ink applied with respect to the light-emitting portion.

As illustrated in FIG. 8A, the Lth non-light-emitting portion 162 in the inter-bank space 160I (R) (which may be considered as a first inter-bank space 1601 for L) has a sub-bank 14 disposed therein. Due to this, in the inter-bank space 160I (R), the abnormality of the nozzle 703 does not affect the area in FIG. 8A located upwards than the Lth non-light-emitting portion 162. Meanwhile, as also illustrated in FIG. 8A, the Lth non-light-emitting portion 162 in each of the inter-bank space 160I+1 (R) and the inter-bank space 160I+2 (R) (each of which may be considered as a second inter-bank space 1602 for L) does not have a sub-bank 14 disposed therein. Due to this, in each of the inter-bank space 160I+1 (R) and the inter-bank space 160I+2 (R), the abnormality of the nozzle 703 affects the area in FIG. 8A located upwards than the Lth non-light-emitting portion 162.

As such, in the panel 10, the direction in which row-direction influence of the ink application amount abnormality spreads in a first inter-bank space 1601 differs from the direction in which the row-direction influence of the ink application amount abnormality spreads in a second inter-bank space 1602. Thus, the risk is reduced of boundaries between light-emitting portions 161 with different thicknesses, in inter-bank spaces in which light-emitting portions 161 exist, forming a line along the row direction. For example, the Lth non-light-emitting portion corresponds to such a boundary in the inter-bank space 160I (R). Meanwhile, the (L−2)th non-light-emitting portion corresponds to such a boundary in each of the inter-bank spaces 160I+1 (R) and 160I+2 (R). Accordingly, in the panel 10, film thickness unevenness between light-emitting portions 161 does not form a line along the row direction.

Meanwhile, in the panel 90, the Lth non-light-emitting portion 962 in every inter-bank space 960 in which light-emitting portions 961 exist has a sub-bank 94 disposed therein, as illustrated in FIG. 8B. Due to this, in each of these inter-bank spaces 960, the abnormality of the nozzle 703 does not affect the area in FIG. 8B located upwards than the Lth non-light-emitting portion 962. Thus, a situation occurs where boundaries between light-emitting portions 961 with different thicknesses, in inter-bank spaces 960 in which light-emitting portions 961 exist, form a line along the row direction. Accordingly, in the panel 90, film thickness unevenness between light-emitting portions 961 forms a line along the row direction.

In the above, description is provided based on an example where ink application amount abnormality occurs only in inter-bank spaces corresponding to the color red (red inter-bank spaces 160R and red inter-bank spaces 960R). However, the above-described effect of the panel 10 is not achieved only when ink application amount abnormality occurs in such a manner. For example, suppose a case where, in the light-emitting layer forming process, an abnormal amount of ink is applied with respect to the light-emitting portion 161 between the Lth non-light-emitting portion 162 and the (L+1)th non-light-emitting portion 162, in each of the inter-bank spaces 160I+2 (R), 160I+2 (G), and 160I+2 (B) in FIG. 8A. In this case, the ink application amount abnormality affects the area in FIG. 8A located upwards than the Lth non-light-emitting portion 162 in each of the inter-bank spaces 160I+2 (R) and 160I+2 (B) (each of which may be considered as a second inter-bank space 1602 for L), whereas the ink application amount abnormality does not affect the area in FIG. 8A located upwards than the Lth non-light-emitting portion 162 in the inter-bank space 160I+2 (G) (which may be considered as a first inter-bank space 1602 for L). Accordingly, in such a case, the risk is reduced of film thickness unevenness between light-emitting portions 161 occurring in the inter-bank spaces 160I+2 (R), 160I+2 (B), and 160I+2 (B) forming a line.

Further, while description is provided in the above based on a case where ink application amount abnormality occurs, the same applies to a case where adhesion of a foreign substance spanning over the row direction occurs. Even in such a case, the direction in which the influence of the foreign particle spreads in a first inter-bank space 1601 differs from the direction in which the influence of the foreign particle spreads in a second inter-bank space 1602. Accordingly, even in such a case, the risk is reduced of film thickness unevenness between light-emitting portions 161 forming a line.

As such, in the panel 10, the risk is reduced of film thickness unevenness between light-emitting portions 161 forming a line, and thus, the risk is reduced of the panel 10 exhibiting a linear luminance unevenness.

5. Supplement

In the panel 10, beneficially, an inter-sub-bank interval is no smaller than 300 μm and no greater than 3000 μm. Here, an inter-sub-bank interval refers to the distance along the column direction between adjacent sub-banks 14, in each of a first inter-bank space 1601 and a second inter-bank space 1602 in the panel 10. This configuration reduces the risk of film thickness unevenness between light-emitting portions 161 occurring.

In particular, when the inter-sub-bank interval is smaller than 3000 μm, the risk increases of film thickness unevenness between light-emitting portions 161 occurring. This is since ink is only able to flow within a very limited area during the forming of the light-emitting layers 16. Such limitation in the area of ink flow results in the amount of ink applied with respect to different areas not being averaged out to a sufficient extent.

Meanwhile, when the inter-sub-bank interval is greater than 3000 μm, film thickness unevenness between light-emitting portions 161 in an inter-bank space 160 is likely to increase when an abnormality has occurred in the inter-bank space 160, such as drying of the ink progressing quickly at a certain area or a foreign substance existing at a certain area. Specifically, when the inter-sub-bank interval is greater than 3000 µm, ink is able to flow across an excessively great area during the forming of the light-emitting layers 16. Thus, when an abnormality as described above has occurred in an inter-bank space 160, a vast area is affected by the abnormality, which results in film thickness unevenness between light-emitting portions occurring over a relatively great area.

In the panel 10, beneficially, the inter-sub-bank interval in a first inter-bank space 1601 differs from the inter-sub-bank interval in a second inter-bank space 1602. The panel 10, due to being configured as such, does not exhibit prominent luminance unevenness.

Specifically, in the panel 10, two light-emitting portions 161 are disposed between a pair of adjacent non-light-emitting portions 162a with sub-banks 14 in the inter-bank space 160I (R), and three light-emitting portions 161 are disposed between a pair of adjacent non-light-emitting portions 162a with sub-banks 14 in the inter-bank space 160I+1 (R), as illustrated in FIG. 8A. Further, four light-emitting portions 161 are disposed between a pair of adjacent non-light-emitting portions 162a with sub-banks 14 in the upper portion of the inter-bank space 160I+2 (R) in FIG. 8A. In short, in the panel 10, the inter-sub-bank interval in the inter-bank space 160I (R), the inter-sub-bank interval in the inter-bank space 160I+1 (R), and the inter-sub-bank interval in the inter-bank space 160I+2 (R) differ.

With the configuration illustrated in FIG. 8A, the abnormality of the nozzle 703 affects two light-emitting portions 161 in the inter-bank space 160I (R). Thus, the two specific light-emitting portions 161 are each formed to have a film thickness of 70. Further, the abnormality of the nozzle 703 affects three light-emitting portions 161 in the inter-bank space 160I+1 (R). Thus, the three specific light-emitting portions 161 are each formed to have a film thickness of 80. Finally, the abnormality of the nozzle 703 affects four light-emitting portions 161 in the inter-bank space 160I+2 (R). Thus, the four specific light-emitting portions 161 are each formed to have a film thickness of 85. Thus, in each inter-bank space 160 in the panel 10, film thickness unevenness between light-emitting portions 161 occurs due to the abnormality of the nozzle 703. However, due to the panel 10 having the configuration described above, the level of film thickness unevenness in one inter-bank space 160 differs from the level of film thickness unevenness in another inter-bank space 160. This non-uniform film thickness unevenness occurring in the panel 10 is not likely to be perceived as a single abnormality, and thus stands out less compared to the uniform film thickness unevenness occurring in the panel 90 (for example, illustrated in FIG. 8B as a state where light-emitting portions having the same thickness 70 form a line). Accordingly, the luminance unevenness occurring when the panel 10 emits light does not stand out much compared to the luminance unevenness occurring when the panel 90 emits light.

Note that in the panel 10, sub-banks 14 in one inter-bank space 160 need not be spaced away from one another by the same distance. For example, this is illustrated by the inter-bank space 160I+2 (R) in FIG. 8A. Further, in the present disclosure, an inter-sub-bank interval in a first inter-bank space 160 is considered as differing from an inter-sub-bank interval in a second inter-bank space 160 as long as the inter-sub-bank interval between at least some of the sub-banks 14 in the first inter-bank space 160 differs from an inter-sub-bank interval between sub-banks 14 in the second inter-bank space 160.

In addition, the panel 10 includes three types of inter-bank spaces 160, i.e., the red inter-bank spaces 160 (R), the green inter-bank spaces 160 (G), and blue the inter-bank spaces 160 (B). Beneficially, the structure described in Section 4 applies when considering only the inter-bank spaces 160 of the same type. For example, when taking the red inter-bank spaces 160 (R) as an example, beneficially, there exists a positive integer N for which a combination of at least one red inter-bank space 160 (R) that may be considered as a first inter-bank space 1601 and at least one red inter-bank space 160 (R) that may be considered as a second inter-bank space 1602 exists. The same applies to the green inter-bank spaces 160 (G) and the blue inter-bank spaces 160 (B). Note that in FIG. 1, among the red inter-bank spaces 160 (R) in the panel 10, the inter-bank space 160I (R) may be considered as a first inter-bank space 1601 for integer L, while the inter-bank space 160I+1 (R) or the inter-bank space 160I+2 (R) may be considered as a second inter-bank space 1602 for integer L.

With the above-described configuration, the risk is reduced of the panel 10 exhibiting a linear luminance unevenness, even when considering only the inter-bank spaces 160 of the same color. Typically, when luminance unevenness between pixels of the same color forms a line, it is likely that the pixels are perceived as forming a single a linear luminance unevenness, and resulting in a prominent luminance unevenness. With the above-described configuration, the risk is reduced of such a luminance unevenness being formed in the panel 10, and thus, the panel 10 achieves high display quality.

Beneficially, in the panel 10, the liquid-repellency of a surface of a sub-bank 14 is lower than the liquid-repellency of a surface of a bank 15. This configuration reduces risks such as the risk of insufficient covering with ink and the risk of film thickness unevenness between light-emitting portions 161 occurring. Typically, a surface of a bank 15 is provided with high liquid-repellency, in order to restrict the flow of ink over the bank 15. Meanwhile, when the liquid-repellency of a surface of a sub-bank 14 is equal to or higher than the liquid repellency of a surface of a bank 15, it becomes difficult for ink to spread into where a surface of a sub-bank 14 and a surface of a bank 15 come into contact. This results in risks such as the risk of insufficient covering with ink and the risk of film thickness unevenness between light-emitting portions 161 occurring.

In addition, beneficially, a height T162 of the light-emitting layer 16 from the top surface of the substrate 11 at a non-light-emitting portion 162 having a sub-bank 14 is greater than a height T161 of the light-emitting layer 16 from the top surface of the substrate 11 at a light-emitting portion 161 adjacent to a non-light-emitting portion 162 having the sub-bank 14 exists. With this configuration, ink flow from near a sub-bank 14 towards light-emitting portions 161 at both sides of the sub-bank 14 occurs during the forming of the light-emitting layers 16. Thus, the risk is reduced of the influence of an abnormality in an inter-bank space 160, such as drying of the ink progressing quickly at a certain area or a foreign substance adhering to a certain area, spreading over and across the sub-bank 14. Thus, the effect of the sub-bank 14 of restricting the flow of ink is enhanced, and film thickness unevenness between light-emitting portions occurring in the inter-bank space 160 due to the abnormality in the inter-bank space 160 is reduced.

6. Modifications

Embodiment 1 describes the panel 10, which pertains to one aspect of the present invention. However, other than the essential features and components described in embodiment 1, the present invention shall not be construed as being limited in any way by embodiment 1. For example, the present invention shall be construed as covering any modification that may be made by a skilled artisan based on the embodiment, and any modification obtainable by combining components and functions described in the embodiment without departing from the scope of the present invention.

The following describes one modification of the panel 10, as one example of such modification. In the following, parts similar to embodiment 1 are provided with the same reference signs, and description of such parts is either simplified or omitted.

(a) Shape of Sub-Bank

FIG. 5 illustrates the shape of a top surface of a sub-bank 14 in the panel 10. Specifically, the top surface is composed of two substantially rectangular portions each protruding from one of two adjacent banks 15 and each perpendicularly crossing the column direction. Further, each of the two substantially rectangular portions has lateral corners that are rounded. However, the sub-bank pertaining to the present invention need not have this specific shape. FIGS. 9A through 9C are schematic plan views illustrating sub-banks pertaining to modifications.

For example, as illustrated in FIG. 9A, the portions of the top surface of the sub-bank, which protrude along the row direction from adjacent banks 15, may have a triangular shape (as with sub-bank 341), a pentagonal shape (as with sub-bank 342), or a substantially semicircular shape (as with sub-bank 343).

Alternatively, for example, the sub-bank may be composed of a single portion covering the entirety of a width W1 of an inter-bank space 160, as illustrated in FIG. 9B. Further, the sub-bank may cover the entirety of a pixel insulating layer 13 (i.e., an area between light-emitting portions 161) (as with sub-bank 441), may cover only a part of a pixel insulating layer 13 (as with sub-bank 442), and may not perpendicularly cross the banks 15 (as with sub-bank 443). In order to achieve the effect of restricting ink flow, the sub-bank suffices to be disposed crossing the column direction at any angle.

Further, for example, the sub-bank may be in contact with only one of the adjacent banks 15 (as with sub-banks 541 and 542), or may not be in contact with any bank 15 (as with sub-bank 543).

Note that in any case, it is beneficial that in each non-light-emitting portion 162 having a sub-bank, there exists at least a part where the sub-bank (or more specifically, a bottom end surface of the sub-bank) covers at least 50% of the width W1 of the inter-bank space 160 (or more specifically, the column-direction width of the inter-bank space 160 at a bottom end surface thereof). For example, as illustrated in FIGS. 9A through 9C, the sub-bank 341 is such that W21+W22 equals at least 50% of width W1, the sub-bank 342 is such that W23+W24 equals at least 50% of width W1, the sub-bank 343 is such that W25+W26 equals at least 50% of width W1, the sub-bank 542 is such that W42 equals at least 50% of width W1, and the sub-bank 543 is such that W43 equals at least 50% of width W1. Note that the sub-banks in FIGS. 9A through 9C are illustrated based on the assumption that the sub-banks each have the same shape at the illustrated top surface and the bottom end surface. Configuring the sub-bank in such a manner ensures that the sub-bank sufficiently achieves the effect of regulating ink flow, and further, reduces the risk of film thickness unevenness between light-emitting portions 161 occurring in an inter-bank space 160 when an abnormality exists in the inter-bank space 160, such as drying of the ink progressing quickly at a certain area or a foreign substance adhering to a certain area. This is since when the sub-bank occupies less than 50% of the width W1 in a non-light-emitting portion 162, the sub-bank cannot sufficiently achieve the effect of restricting ink flow.

Further, when forming a path of ink flow in the sub-bank, as in the sub-banks 14, 341, 342, 343, 541, 542, and 543, beneficially, the sub-bank is configured so that the path of ink flow spreads out at an end portion of the sub-bank along the column direction. This structure enables ink to flow smoothly along the ink flow path, and reduces the risk of insufficient covering by ink and unevenness.

Further, note that it is not necessary for all sub-banks to have the same top surface shape. For example, sub-banks in different inter-bank spaces 160 may have different top surface shapes, as illustrated in FIGS. 9A through 9C.

Each of FIGS. 10A and 10B is a schematic cross-sectional view illustrating the structure of sub-banks. FIG. 10A illustrates the sub-bank pertaining to embodiment 1 and a sub-bank pertaining to a modification, and FIG. 10B illustrates sub-banks pertaining to modifications. The sub-bank 14 pertaining to embodiment 1 is such that the height T141 of the sub-bank 14 from the top surface of the substrate 11 is smaller than the height T15 of a bank 15 from the top surface of the substrate 11. However, the sub-bank pertaining to aspects of the present invention are not limited in this way. For example, the sub-bank may be such that the height T142 thereof from the top surface of the substrate 11 is greater than the height T15 (as with sub-bank 642), or such that the height thereof from the top surface of the substrate 11 is equal to the height T15 (as with sub-bank 643).

In any case, beneficially, the height of the sub-bank from the top surface of the substrate 11 is no smaller than 10% and no greater than 110% of the height T15. With a height smaller than 10% of the height T15, the sub-bank would not be able to sufficiently achieve the effect of restricting ink flow. Meanwhile, with a height greater than 110% of the height T15, there is a risk of ink, due to surface tension, spreading along the surface of the sub-bank and flowing over the banks 15.

Further, when the height of the sub-bank from the top surface of the substrate 11 equals the height of a bank 15 from the top surface of the substrate 11, as with the sub-bank 643, the sub-banks and the banks 15 can be formed through a single process. This reduces the number of processes and facilities required in the manufacturing of the panel 10, and enables efficient manufacturing of the panel 10.

In embodiment 1, a sub-bank 14 does not extend out from the area above a pixel insulating layer 13. However, a sub-bank may extend out from the area above a pixel insulating layer 13 and onto a pixel electrode, as with the sub-bank 645 illustrated in FIG. 10B. When making this modification, beneficially, a surface 645a of a part of the sub-bank 645 located on a pixel electrode 12 is curved concave towards a bank 15 as illustrated in FIG. 11. FIG. 11 is a schematic plan view illustrating the structure of the sub-bank 645. This configuration allows a light-emitting layer 16 with a rounded corner portion to be formed near where a pixel electrode 12 and a surface of a sub-bank 14 come in contact with one another. Consequently, the risk is reduced of insufficient covering by ink and film thickness unevenness between light-emitting portions 161 occurring. In particular, when a portion of a pixel electrode 12 remains insufficiently covered by ink, a short circuit may be formed between the portion of the pixel electrode 12 and the counter electrode 17. The above-described configuration is beneficial for this reason. Note that even when making this configuration, a portion of a light-emitting layer 16 formed on a portion of the sub-bank 645 that is located on a pixel electrode 12. would be included in a non-light-emitting portion 162. Due to this, the sub-bank 645 would still be located inside a non-light-emitting portion 162.

(b) Other Modifications

In embodiment 1, only a light-emitting layer 16 exists between a pixel electrode 12 and the counter electrode 17. However, a modification may be made such that at least one additional layer, such as a hole injection layer, a hole transport layer, an electron transport layer, and/or an electron injection layer, exists between a pixel electrode 12 and the counter electrode 17. Further, each of one or more such additional layers disposed between a pixel electrode 12 and the counter electrode 17 need not be made of an organic compound, and may be made of an inorganic substance or the like.

In embodiment 1, one light-emitting layer 16 extends continuously over one inter-bank space 160. However, the light-emitting layer 16 need not be continuous in such a manner, as long as the light-emitting layer 16 covers each pixel electrode 12. For example, the light-emitting layer 16 may be discontinuous at a part of the inter-bank space 160, for example at a part where a sub-bank 14 is located.

In embodiment 1, the light-emitting portions 161 are classified into three types, namely red light-emitting portions 161R, green light-emitting portions 161G, and blue light-emitting portions 161B. However, all the light-emitting portions 161 may be of the same type, or alternatively, the light-emitting portions 161 may be classified into four types, each of which corresponding to a different one of the light-emission colors red, green, blue, and yellow.

In embodiment 1, an inter-bank space 160 accommodates only light-emitting portions 161 emitting light of the same color. However, a modification may be made such that inter-bank spaces are classified into inter-bank spaces 160 in which red light-emitting portions 161R and blue light-emitting portions 161B are disposed in alternation, and green inter-bank spaces 160G.

In embodiment 1, the light-emitting portions 161 are disposed to form a matrix. However, the present invention achieves the same effects also when corresponding light-emitting portions in adjacent inter-bank spaces are offset with respect to one another along the column direction by half the pitch between light-emitting portions. Here, it should be noted that due to the increase in definition of display panels, a certain level of offset along the column direction is not likely to be visually perceived. Due to this, even if film thickness unevenness between light-emitting portions forms a line with a certain level of width (or form a zigzag pattern), the film thickness unevenness is typically visually perceived as a line. The present invention, even in such a case, reduces the risk of film thickness unevenness between light-emitting portions forming a zigzag pattern, and thus, achieves a display panel with high display quality.

In embodiment 1, a light-emitting portion 161 is formed on a portion of a pixel electrode 12 that is not covered by any pixel insulating layer 13. That is, a light-emitting portion 161 is formed only on a part of a pixel electrode 12. However, for example, a light-emitting portion 161 may be formed on an entirety of a pixel electrode 12, by forming each pixel insulating layer 13 at an area between a pair of pixel electrodes 12, such that each pixel insulating layer 13 does not have a portion on any pixel electrode 12.

Further, in embodiment 1, pixel electrodes 12 that are disposed adjacent to one another along the row direction are electrically insulated from one another by a bank 15. However, the electrical insulation between such pixel electrodes 12 lined up along the row direction may be provided by an electrically-insulative layer disposed lower than the bank 15. When making this modification, the electrically-insulative layer may form a single layer with pixel insulating layers 13.

Further, each inter-bank space 160 illustrated in FIG. 1 pertaining to embodiment 1 has pixel electrodes 12 disposed therein. However, not all inter-bank spaces 160 need to have pixel electrodes 12 disposed therein, as long as each of a first inter-bank space 1601 and a second inter-bank space 1602 have pixel electrodes 12 disposed therein. For example, the panel 10 may include at least one inter-bank space 160 not having pixel electrodes 12 disposed and instead, having a bus bar or the like formed therein.

Further, in embodiment 1, for one positive integer N, each of a first inter-bank space 1601 and a second inter-bank space 1602 can be selected from among a plurality of candidate inter-bank spaces 160. Further, there exist multiple positive integers N for which a combination of a first inter-bank space 1601 and a second inter-bank space 1602 exists. However, it suffices that for one positive integer N, at least one combination of a first inter-bank space 1601 and a second inter-bank space 1602 exists. Further, it suffices that a combination of a first inter-bank space 1601 and a second inter-bank space 1602 exists for at least one positive integer N.

In embodiment 1, a sub-bank 14 is separate from other components, such as a pixel insulating layer 13 and a bank 15. However, for example, a sub-bank may be a part of a pixel insulating layer or a bank. Note that when a sub-bank is a part of another component, the determination of whether a part of a given component is a sub-bank (whether it can be said that a non-light-emitting portion in which the part of the given component is disposed has a sub-bank) is to made based on a relative basis. For example, a determination may be made that, among a plurality of non-light-emitting portions inside an inter-bank space, a given non-light-emitting portion has a sub-bank when the given non-light-emitting portion achieves a greater effect of restricting ink flow along the column direction than other non-light-emitting portions due to having a structure/characteristic (the height from the top surface of the substrate, the length in the direction crossing the bank, liquid repellency, etc.,) differing from the other non-light-emitting portions. Meanwhile, even if there exists a non-light-emitting portion with a part having a slight effect of restricting ink flow, such as the pixel insulating layer 13, the non-light-emitting portion should not be immediately determined as being a non-light-emitting portion having a sub-bank.

In embodiment 1, the panel 10 has the structure of a top-emission-type panel. However, the panel 10 may have the structure of a bottom-emission-type panel. The modifications that need to be made to components when providing the panel 10 with the structure of a bottom-emission-type panel can be made as necessary.

Further, in embodiment 1, the panel 10 employs the active-matrix scheme. However, the panel 10 may employ the passive-matrix scheme, for example. Specifically, the panel 10 may be modified to employ the passive-matrix scheme by providing a plurality of linear electrodes extending parallel with the direction in which the banks extend, and a plurality of linear electrodes extending in a direction perpendicular to the direction in which the banks extend, with the two types of linear electrodes disposed to sandwich the light-emitting layers. Further, when setting the linear electrodes extending in a direction perpendicular to the direction in which the banks extend as lower electrodes, a plurality of such lower electrodes would line up along the direction in which the banks extend while being spaced away from one another in each inter-bank space. Thus, one aspect of the present invention is achieved. The modifications that need to be made to components when configuring the panel 10 to employ the passive-matrix scheme can be made as necessary. Further, in embodiment 1, the substrate 11 includes a TFT layer. However, as can be seen from the example above where the panel 10 employs the passive-matrix scheme, the substrate 11 need not include a TFT layer.

Embodiment 2

The following describes an organic EL display device 1 pertaining to embodiment 2 of the present invention, with reference to FIG. 12. FIG. 12 is a block diagram illustrating the overall structure of the organic EL display device 1.

1. Structure of Organic EL Display Device 1

The organic EL display device 1 pertaining to embodiment 2 includes the organic EL display panel 10 pertaining to embodiment 1. The organic EL display device 1 also includes a driving/control unit 20 connected to the panel 10.

The driving/control unit 20 includes four driving circuits (namely, driving circuits 21 through 24) and a control circuit 25. Note that in the organic EL display device 1, the driving/control unit 20 may be arranged at any position with respect to the panel 10.

2. Operation of Organic EL Display Device 1

When an image is to be displayed onto the panel 10, which employs the active-matrix scheme, the driving circuits 21 through 24 apply a voltage to predetermined ones of the pixel electrodes 12 via the TFTs formed in the substrate 11 of the panel 10. As a result, current flows between each predetermined pixel electrode 12 and the counter electrode 17, which results in a light-emitting portion 161 corresponding to the predetermined pixel electrode 12 emitting light. Accordingly, the panel 10, when seen as a whole, is capable of displaying a color image.

3. Effects Achieved

The organic EL display device 1 includes the organic EL display panel 10, which presents or reduces the risk of exhibiting a linear luminance unevenness. As such, the organic EL display device 1 achieves high display quality.

INDUSTRIAL APPLICABILITY

The organic EL display panel, the manufacturing method of the organic EL display panel, and the organic EL display device pertaining to the present invention are widely applicable to devices such as television sets, personal computers, and mobile phones, and various other electronic devices having display panels.

REFERENCE SIGNS LIST

1 Organic EL display device
10, 90 Organic EL display panel
11 Substrate
12 Pixel electrode
13, 93 Pixel insulating layer
14, 94, 341, 342, 343, 441, 442, 443, 541, 542, 543, 642, 643, 645 Sub-bank
15, 95 Bank
16 Light-emitting layer
17 Counter electrode
18 Sealing layer
20 Driving/control unit
21-24 Driving circuit
25 Control circuit
160, 960 Inter-bank space
161, 961 Light-emitting portion
162, 962 Non-light-emitting portion
701-706 Nozzle
1601 First inter-bank space
1602 Second inter-bank space

The invention claimed is:

1. An organic electroluminescence (EL) display panel, comprising:
   a substrate;
   at least three banks above the substrate, all linearly extending along one direction;
   a plurality of pixel electrodes disposed spaced away from one another along the one direction, in each of a first inter-bank space and a second inter-bank space included among inter-bank spaces defined by the at least three banks, each inter-bank space being a space between a different pair of adjacent ones of the at least three banks;
   a light-emitting layer in each of the first inter-bank space and the second inter-bank space, the light-emitting layer covering at least a portion of each of the pixel electrodes disposed in the each of the first inter-bank space and the second inter-bank space; and
   a sub-bank disposed at least in the first inter-bank space, the sub-bank crossing the one direction,
   wherein when defining each portion of the light-emitting layer that covers one of the pixel electrodes as a light-emitting portion of the organic EL display panel, and defining each area between a pair of light-emitting portions adjacent in the one direction as a non-light-emitting portion of the organic EL display panel, there exists a positive integer N for which the following holds true:
   wherein among Nth non-light-emitting portions of the organic EL display panel counting from one side of the organic EL display panel along the one direction, the Nth non-light-emitting portion in the first inter-bank space has the sub-bank disposed therein and the Nth non-light-emitting portion in the second inter-bank space does not have the sub-bank disposed therein, and
   wherein each non-light-emitting portion having a sub-bank disposed therein has at least a portion where a width of a bottom surface of the sub-bank along a direction perpendicular to the one direction covers 50% or more of a width of a bottom surface of a corresponding inter-bank space along the direction perpendicular to the one direction.

2. The organic EL display panel of claim 1,
   wherein in each of the first inter-bank space and the second inter-bank space, two or more sub-banks are disposed along the one direction spaced away from one another by a distance of no smaller than 300 μm and no greater than 3000 μm.

3. The organic EL display panel of claim 2,
   wherein in the first inter-bank space, the sub-banks are disposed spaced away from one another by a first distance along the one direction, and
   in the second inter-bank space, the sub-banks are disposed spaced away from one another by a second distance along the one direction, the second distance differing from the first distance.

4. The organic EL display panel of claim 1,
wherein each light-emitting portion in the first inter-bank space emits the same color as each light-emitting portion in the second inter-bank space.

5. The organic EL display panel of claim 1,
wherein a surface portion liquid-repellency of the sub-bank is smaller than a surface portion liquid-repellency of the banks.

6. The organic EL display panel of claim 1,
wherein the light-emitting layer extends continuously from one of two adjacent light-emitting portions into a non-light-emitting portion between the two adjacent light-emitting portions and in which a sub-bank is disposed, and further into the other one of the two adjacent light-emitting portions, and
a height of the light-emitting layer, with respect to a top surface of the substrate, is greater at a portion of the light-emitting layer corresponding to the non-light-emitting portion than at portions of the light-emitting layer corresponding to the two adjacent light-emitting portions.

7. The organic EL display panel of claim 1,
wherein the sub-bank has a portion located on a pixel electrode, and
a surface of the portion of the sub-bank on the pixel electrode is curved concave towards one bank.

8. The organic EL display panel of claim 1,
wherein a height of the sub-bank, with respect to a top surface of the substrate, is no less than 10% and no greater than 110% of a height of the banks, with respect to the top surface of the substrate.

9. The organic EL display panel of claim 1,
wherein a height of the sub-bank, with respect to a top surface of the substrate, is equal to a height of the banks, with respect to the top surface of the substrate.

10. An organic electroluminescence (EL) display device, comprising:
an organic electroluminescence (EL) display panel, which includes
a substrate;
at least three banks above the substrate all linearly extending along one direction;
a plurality of pixel electrodes disposed spaced away from one another along the one direction, in each of a first inter-bank space and a second inter-bank space included among inter-bank spaces defined by the at least three banks, each inter-bank space being a space between a different pair of adjacent ones of the at least three banks;
a light-emitting layer in each of the first inter-bank space and the second inter-bank space, the light-emitting layer covering at least a portion of each of the pixel electrodes disposed in the each of the first inter-bank space and the second inter-bank space; and
a sub-bank disposed at least in the first inter-bank space, the sub-bank crossing the one direction,
wherein when defining each portion of the light-emitting layer that covers one of the pixel electrodes as a light-emitting portion of the organic EL display panel, and defining each area between a pair of light-emitting portions adjacent in the one direction as a non-light-emitting portion of the organic EL display panel, there exists a positive integer N for which the following holds true:
wherein among Nth non-light-emitting portions of the organic EL display panel counting from one side of the organic EL display panel along the one direction, the Nth non-light-emitting portion in the first inter-bank space has the sub-bank disposed therein and the Nth non-light-emitting portion in the second inter-bank space does not have the sub-bank disposed therein, and
wherein each non-light-emitting portion having a sub-bank disposed therein has at least a portion where a width of a bottom surface of the sub-bank along a direction perpendicular to the one direction covers 50% or more of a width of a bottom surface of a corresponding inter-bank space along the direction perpendicular to the one direction.

\* \* \* \* \*